United States Patent
Matsuoka

(10) Patent No.: US 11,929,106 B2
(45) Date of Patent: Mar. 12, 2024

(54) SEMICONDUCTOR MEMORY DEVICE

(71) Applicant: Kioxia Corporation, Tokyo (JP)

(72) Inventor: Fumiyoshi Matsuoka, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 203 days.

(21) Appl. No.: 17/691,198

(22) Filed: Mar. 10, 2022

(65) Prior Publication Data

US 2023/0091134 A1 Mar. 23, 2023

(30) Foreign Application Priority Data

Sep. 17, 2021 (JP) ................................. 2021-152414

(51) Int. Cl.
*G11C 7/18* (2006.01)
*G11C 5/08* (2006.01)
*G11C 11/16* (2006.01)

(52) U.S. Cl.
CPC ............ *G11C 11/1675* (2013.01); *G11C 5/08* (2013.01); *G11C 11/1673* (2013.01); *G11C 11/1693* (2013.01)

(58) Field of Classification Search
CPC ... G11C 11/1675; G11C 5/08; G11C 11/1673; G11C 11/1693; G11C 8/08; G11C 11/1655; G11C 11/1657; G11C 8/12; G11C 8/14; G11C 7/18

USPC .......................................................... 365/158
See application file for complete search history.

(56) References Cited

U.S. PATENT DOCUMENTS

| | | | |
|---|---|---|---|
| 9,972,373 B2 | 5/2018 | Andre et al. | |
| 10,186,316 B2 | 1/2019 | Ueda | |
| 10,475,497 B2 | 11/2019 | Alam et al. | |
| 11,355,170 B1* | 6/2022 | Yudanov | G11C 11/4085 |
| 2018/0277177 A1* | 9/2018 | Takaya | G11C 7/1051 |
| 2018/0277187 A1* | 9/2018 | Ikegami | G11C 11/1675 |
| 2021/0090629 A1 | 3/2021 | Hatsuda | |
| 2021/0151101 A1* | 5/2021 | Lee | G11C 11/5607 |

FOREIGN PATENT DOCUMENTS

| | | |
|---|---|---|
| JP | 2018156697 A | 10/2018 |
| JP | 2021047950 A | 3/2021 |

* cited by examiner

*Primary Examiner* — Huan Hoang
(74) *Attorney, Agent, or Firm* — Holtz, Holtz & Volek PC

(57) ABSTRACT

A first memory cell includes a first variable resistance element and a first switching element. A control circuit is configured to execute first detection of detecting a first value of a first physical quantity related to the first memory cell, execute first write for storing first data in the first memory cell, execute second detection of detecting a second value of the first physical quantity related to the first memory cell following the first write, and read second data related to the first memory cell based on the first value and the second value. At least one of the first value and the second value is a value during a change in the first physical quantity related to the first memory cell.

14 Claims, 17 Drawing Sheets

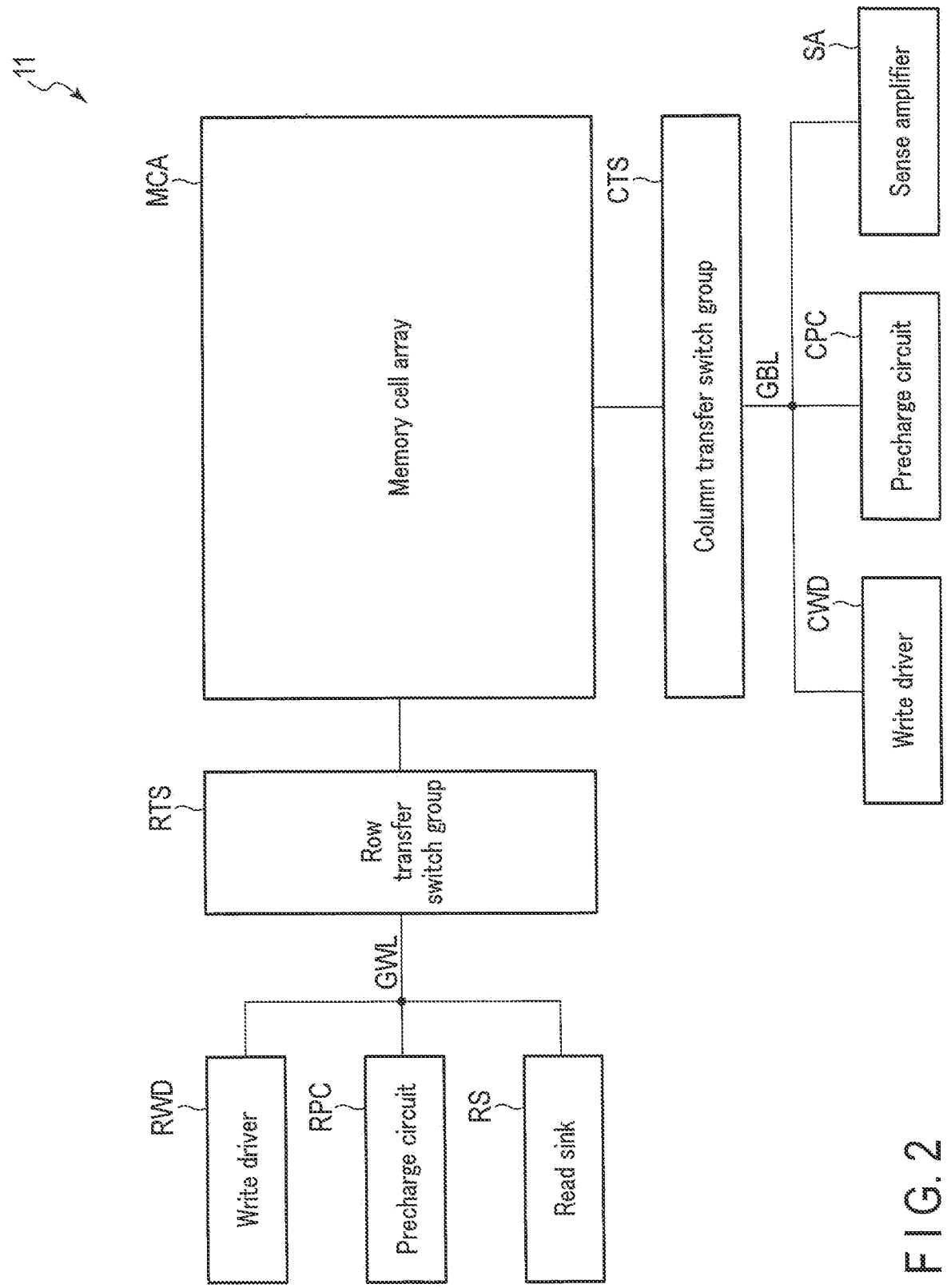
F I G. 2

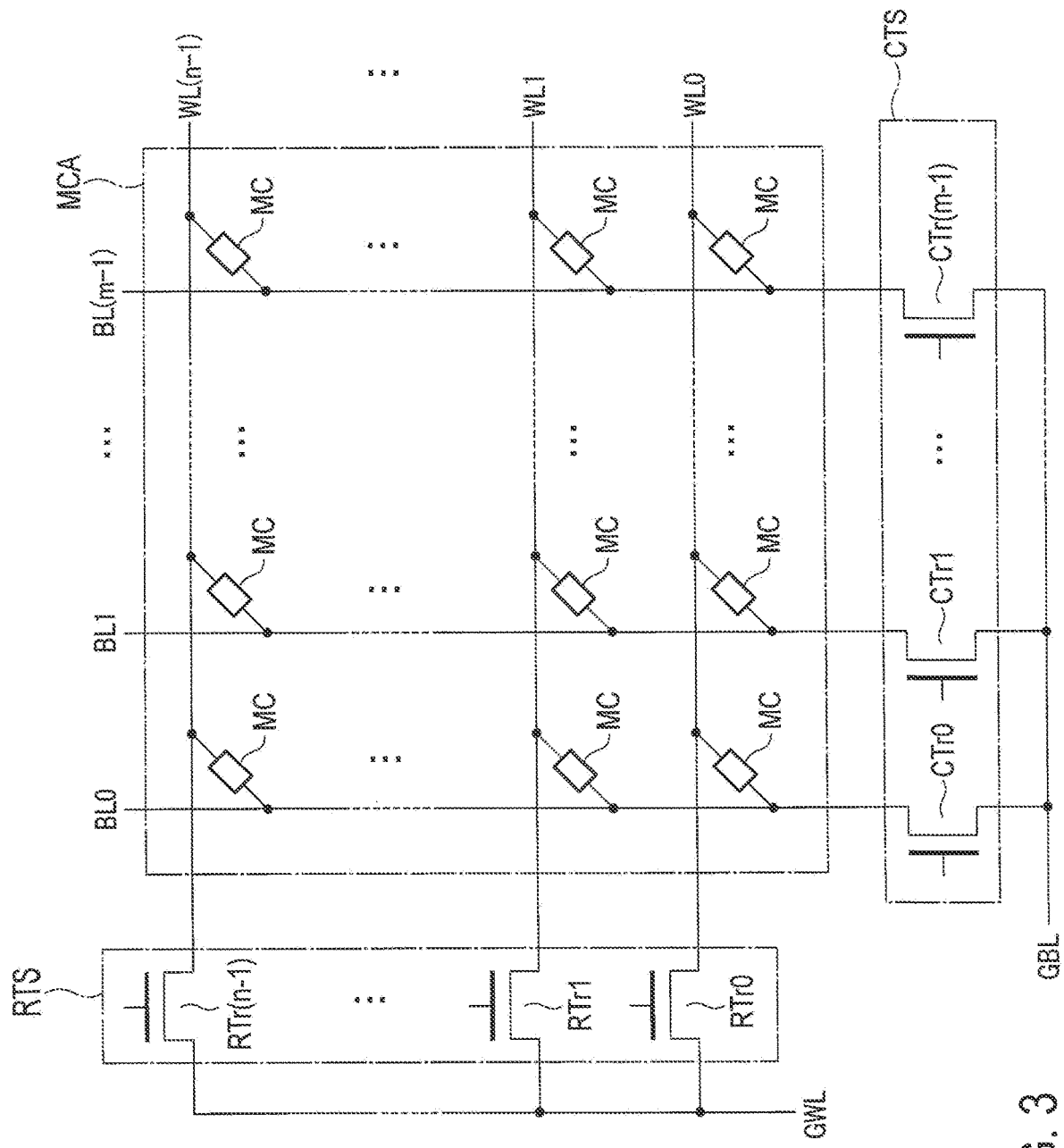
F I G. 3

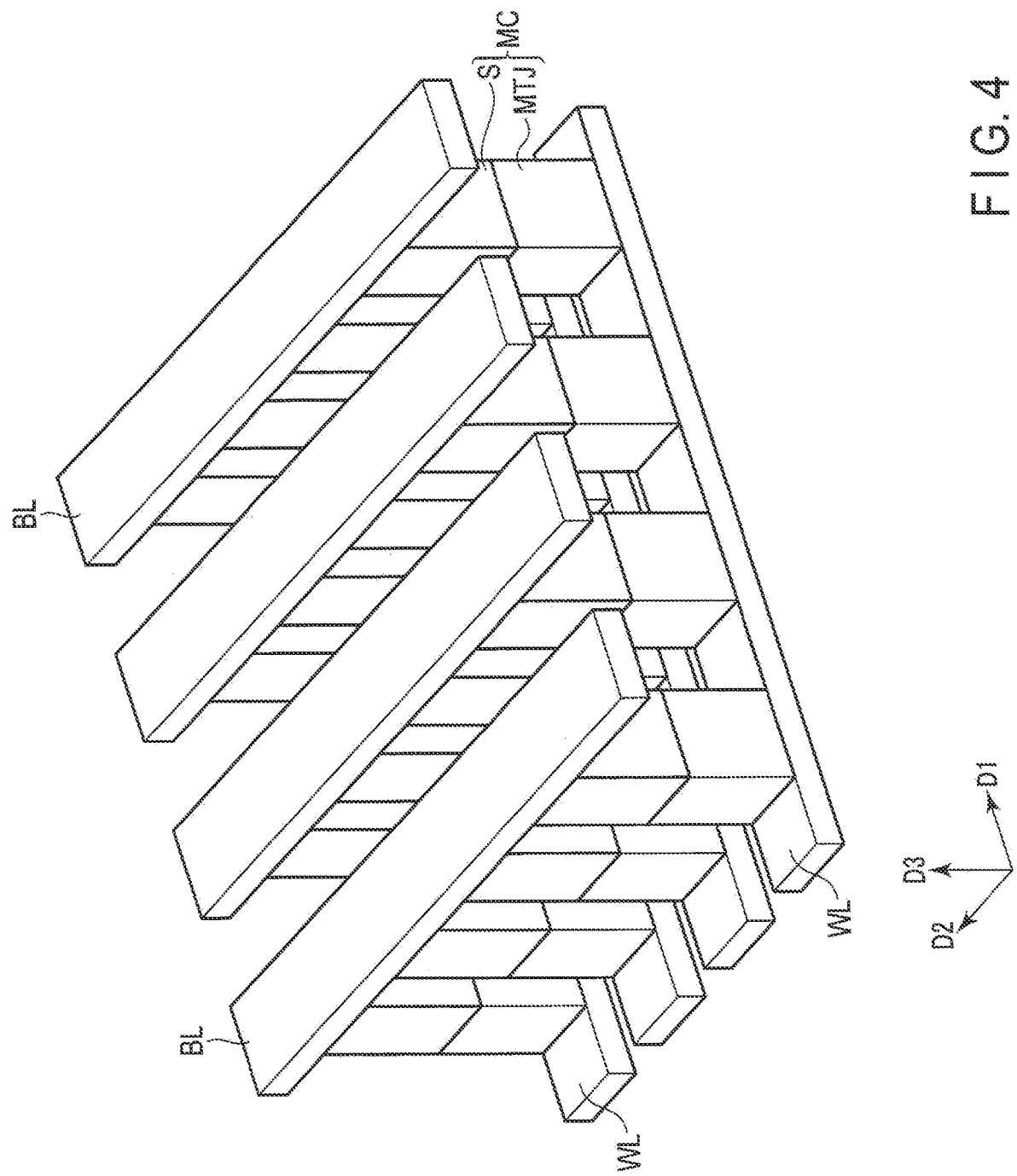
F I G. 4

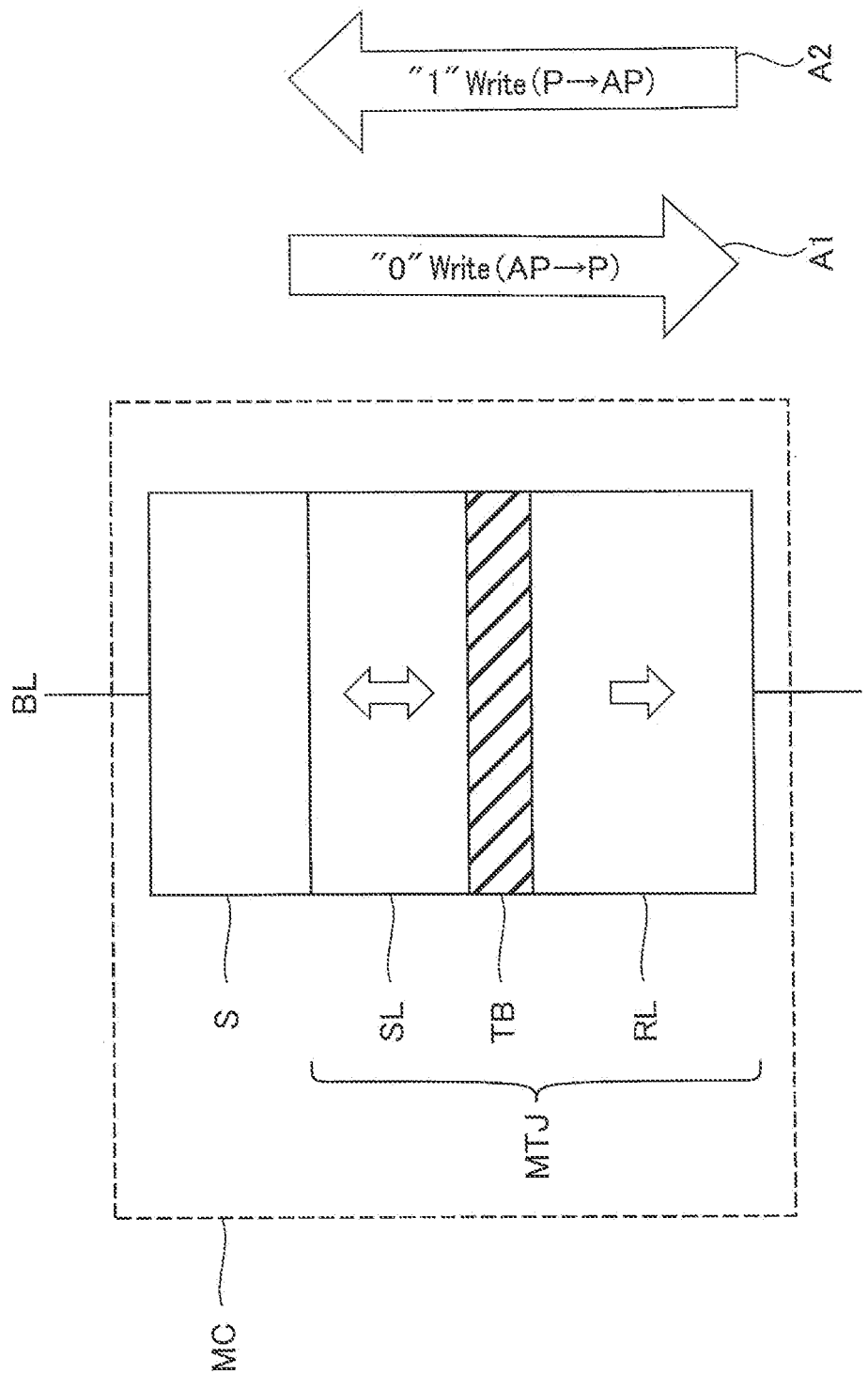
F I G. 5

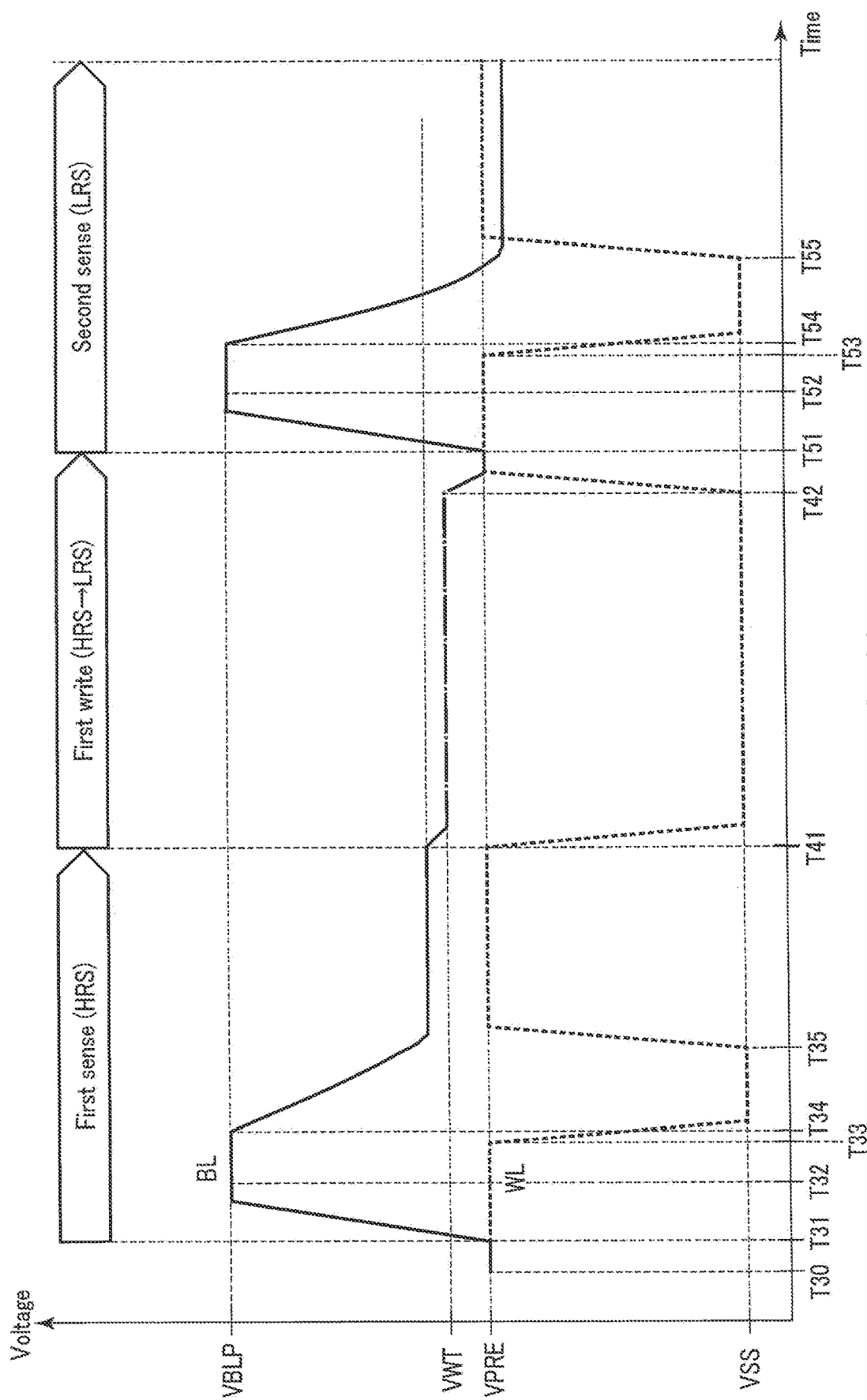
F I G. 12

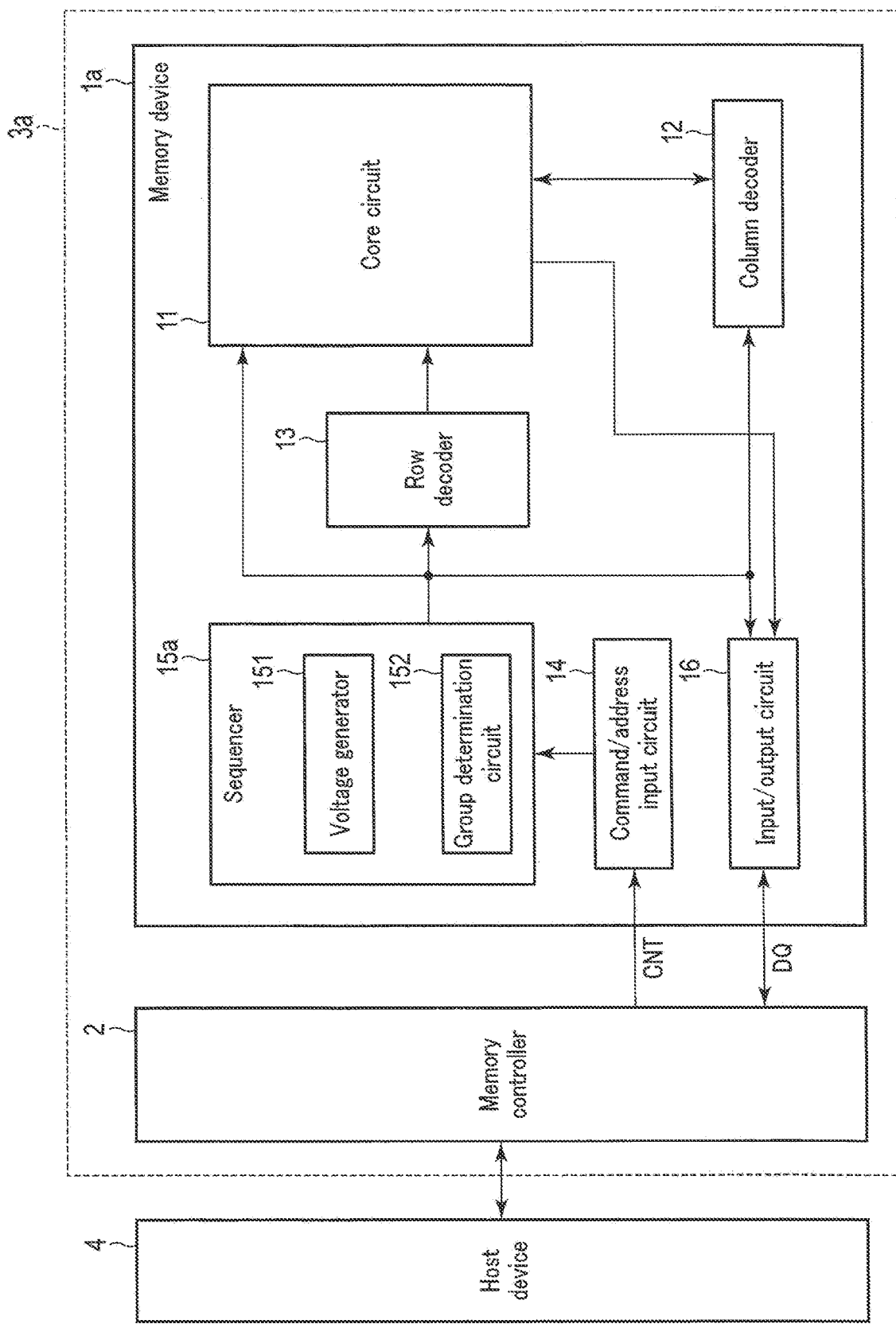
F I G. 14

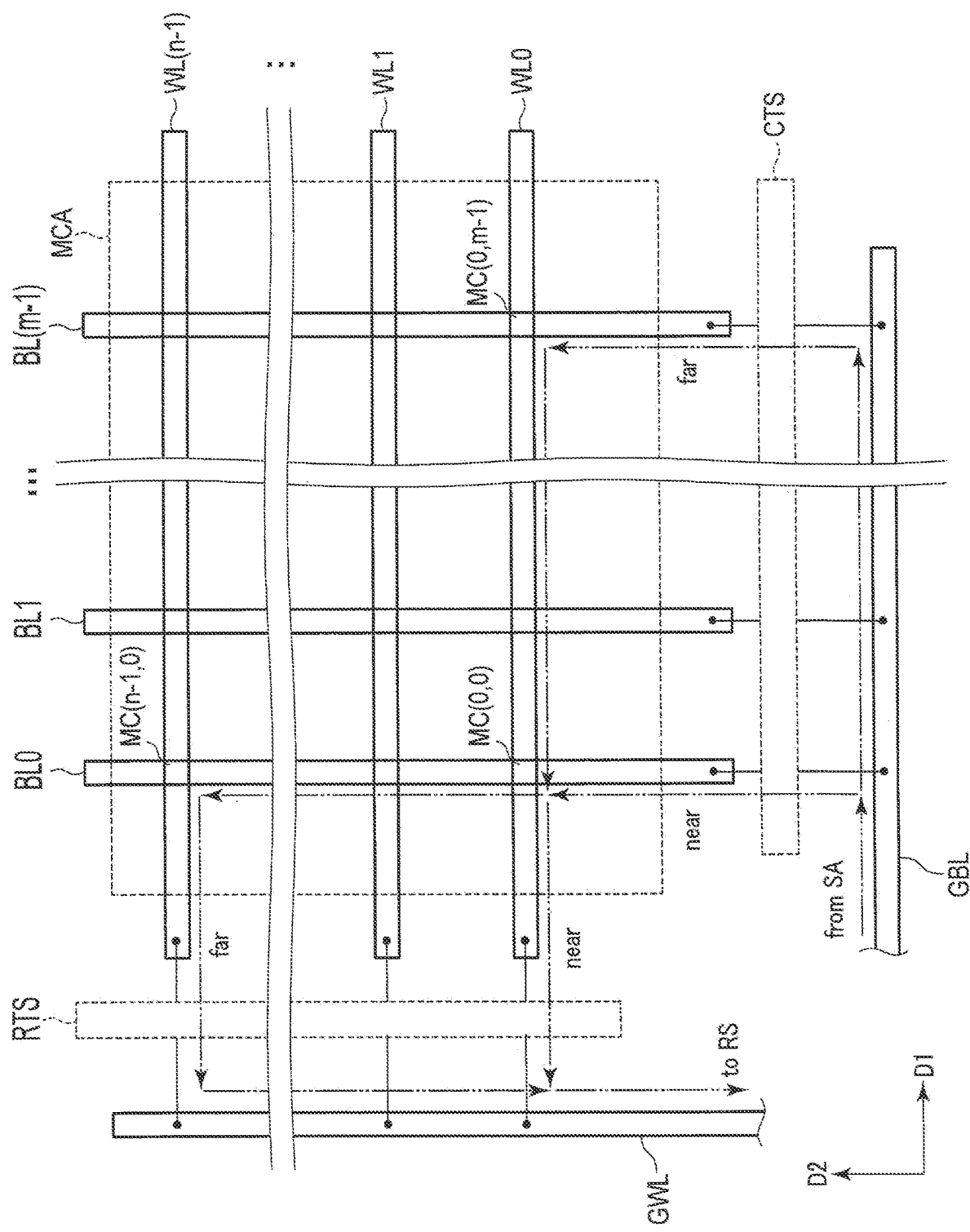
F I G. 15

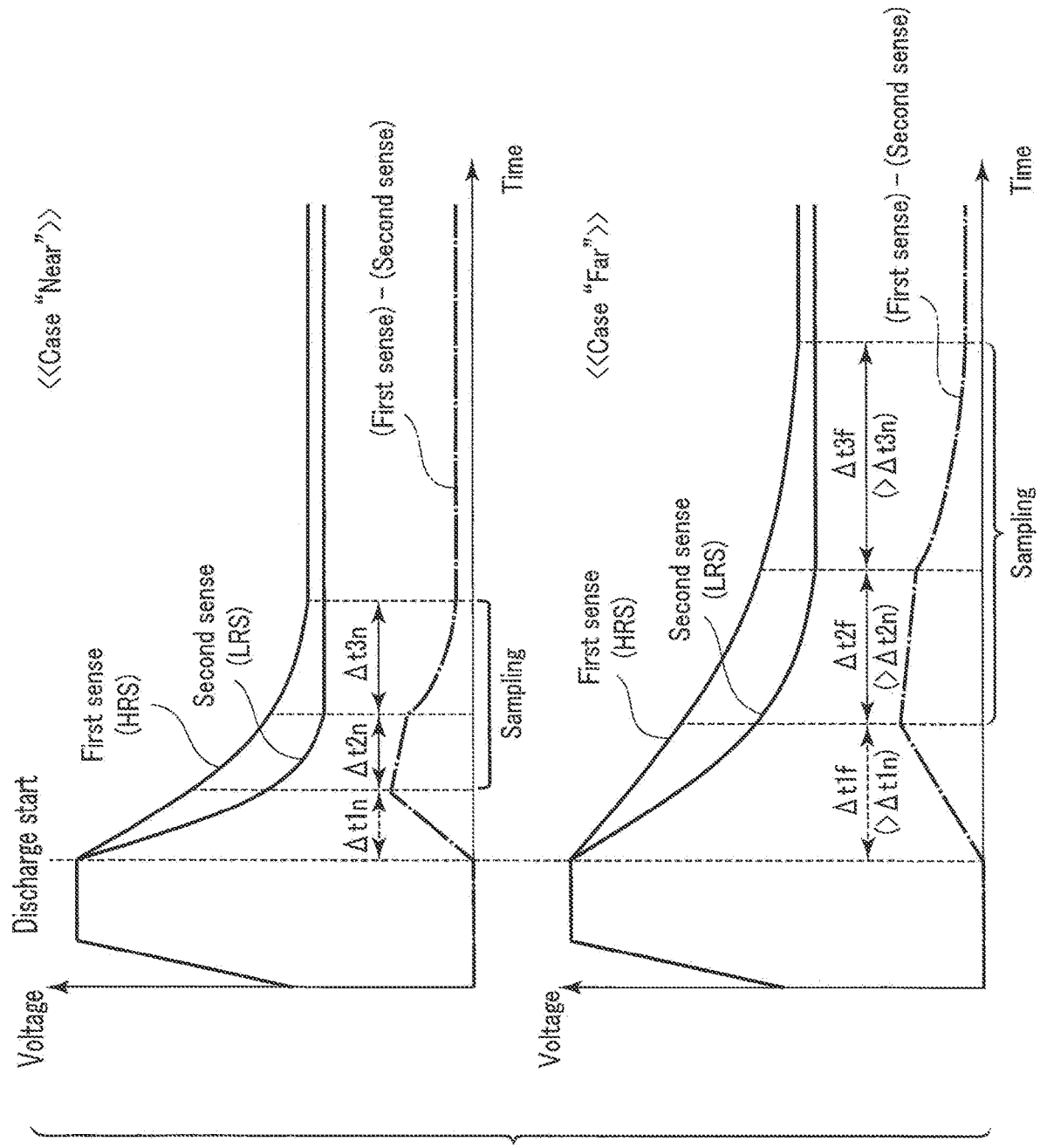
F I G. 17

SEMICONDUCTOR MEMORY DEVICE

CROSS-REFERENCE TO RELATED APPLICATIONS

This application is based upon and claims the benefit of priority from Japanese Patent Application No. 2021-152414, filed Sep. 17, 2021, the entire contents of which are incorporated herein by reference.

FIELD

Embodiments described herein relate generally to a memory device.

BACKGROUND

A memory device having a magnetic element is known.

BRIEF DESCRIPTION OF THE DRAWINGS

FIG. 2 is a block diagram illustrating an example of a configuration of a core circuit of the memory device according to the first embodiment;

FIG. 3 is a diagram illustrating an example of a circuit configuration of a memory cell array of the memory device according to the first embodiment;

FIG. 4 is a diagram illustrating an example of a part of a structure of the memory cell array of the memory device according to the first embodiment;

FIG. 5 is a cross-sectional diagram illustrating an example of a configuration of a certain memory cell of the memory device according to the first embodiment;

FIG. 12 is a diagram illustrating an example of a timing chart illustrating temporal changes in voltages applied to a bit line and a word line corresponding to a selected memory cell when a memory device according to a modification of the first embodiment executes a certain read operation;

FIG. 14 is a block diagram illustrating an example of a configuration of a memory device according to a second embodiment;

FIG. 15 is a diagram illustrating an example of a layout of various interconnects that can serve as a voltage transfer path to each memory cell of the memory device according to the second embodiment;

FIG. 17 is a diagram for explaining timing of voltage sampling in a first sense operation and a second sense operation by a sense amplifier of the memory device according to the second embodiment.

DETAILED DESCRIPTION

Figure 1:
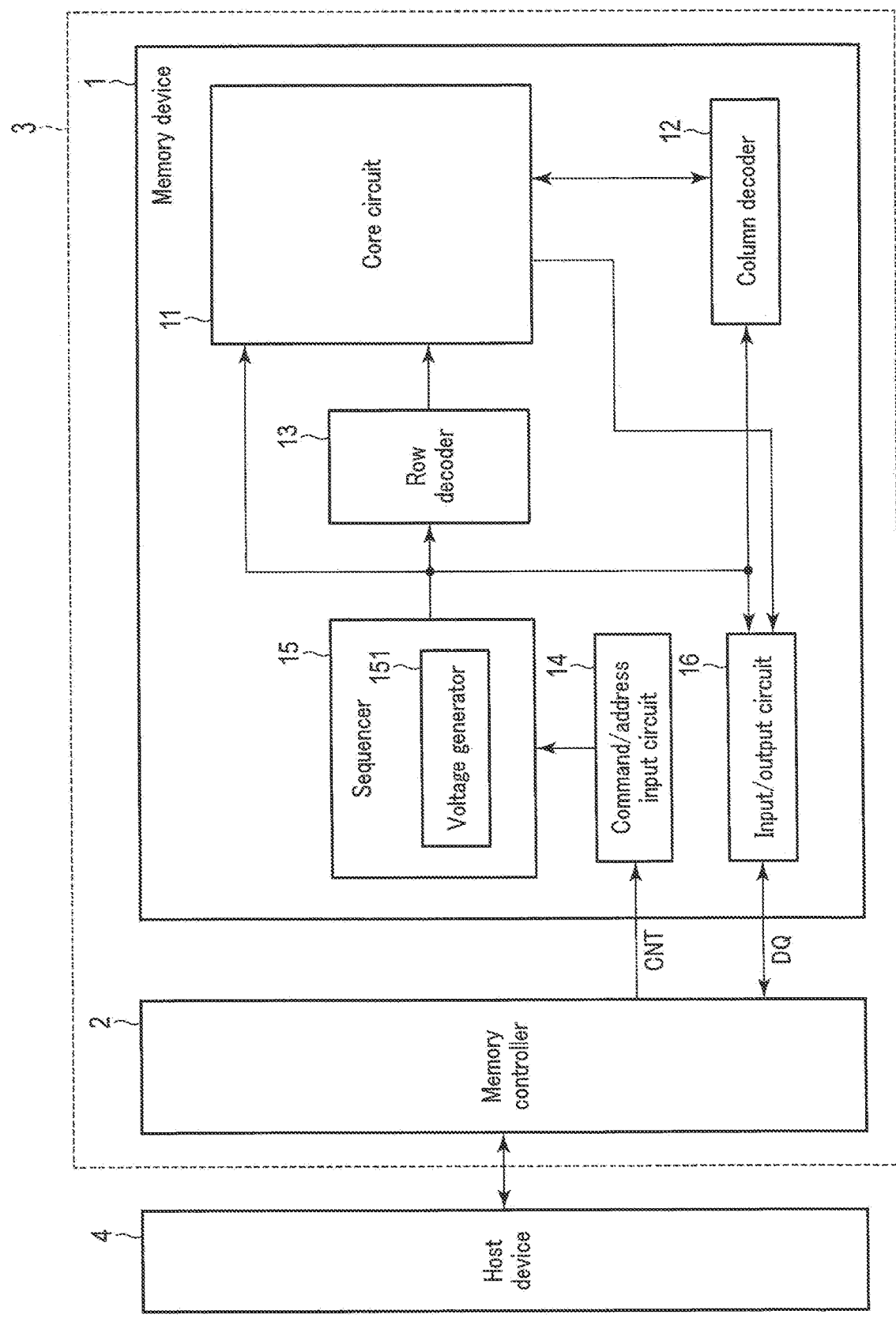
FIG. 1 is a block diagram illustrating an example of a configuration of a memory device according to a first embodiment.

In general, according to one embodiment, a memory device includes a first memory cell; and a control circuit. The first memory cell includes a first variable resistance element and a first switching element. The control circuit is configured to execute first detection of detecting a first value of a first physical quantity related to the first memory cell, execute first write for storing first data in the first memory cell, execute second detection of detecting a second value of the first physical quantity related to the first memory cell following the first write, and read second data related to the first memory cell based on the first value and the second value. At least one of the first value and the second value is a value during a change in the first physical quantity related to the first memory cell.

Hereinafter, embodiments will be described with reference to the drawings. In the following description, components having the same function and configuration are denoted by the same reference numerals, when a plurality of components having a common reference numeral is distinguished, the common reference numeral is added with a suffix for distinguishing. In a case where a plurality of components does not need to be particularly distinguished, only a common reference numeral is attached to the plurality of components, and suffixes are not attached.

Each functional block can be realized by any one of hardware and software or a combination of both. In addition, it is not essential that functional blocks are distinguished as described below. For example, some functions may be executed by a functional block different from the exemplary functional block. Further, the exemplary functional blocks may be divided into finer functional sub-blocks. In addition, the names of the functional blocks and the components in the following description are for convenience, and do not limit the configurations and operations of the functional blocks and the components.

<First Embodiment>

Hereinafter, a memory device 1 according to the first embodiment will be described.

[Configuration Example]

(1) Memory Device

FIG. 1 is a block diagram illustrating an example of a configuration of the memory device 1 according to the first embodiment.

The memory device 1 according to the first embodiment can store data in a nonvolatile manner. More specifically, the memory device 1 is, for example, a perpendicular magnetization type magnetoresistive memory device (MRAM: magnetoresistive random access memory) using, as a memory element, a variable resistance element using a tunneling magnetoresistance (TMR) effect by magnetic tunnel junction (MTJ). The TMR effect is a phenomenon in which, for example, the magnetization direction of a ferromagnet is changed by application of a magnetic field or a current, whereby the electric resistance of the element is changed when the tunnel current flows.

In FIG. 1, in addition to the memory device 1, a memory controller 2 and a host device 4 are also illustrated. The memory device 1 and the memory controller 2 constitute a memory system 3.

The memory controller 2 receives a host command from the host device (external device) 4 such as a personal computer, and controls the memory device 1 based on the host command. Under the control, various operations such as an operation of storing data in the memory device 1 (hereinafter, referred to as a write operation) and an operation of reading data from the memory device 1 (hereinafter, referred to as a read operation) are executed.

Signals transmitted between the memory controller 2 and the memory device 1 in relation to the control will be described.

The memory controller 2 is coupled to the memory device 1 via a memory bus. The memory bus transmits, for example, a data signal DQ and an external control signal CNT. The data signal DQ includes write data or read data. The external control signal CNT includes, for example, a command and address information.

Next, details of the configuration of the memory device 1 will be described.

The memory device 1 includes a core circuit 11, a column decoder 12, a row decoder 13, a command/address input circuit 14, a sequencer 15, and an input/output circuit 16.

The core circuit 11 includes a plurality of nonvolatile memory cells associated with word lines and bit lines. The word lines include a global word line and local word lines. The bit lines include a global bit line and local bit lines. Hereinafter, the local word line is simply referred to as a word line. Similarly, the local bit line is simply referred to as a bit line. In the write operation, write data is stored in the memory cell in the core circuit 11. In the read operation, read data is read from the memory cell in the core circuit 11.

The command/address input circuit 14 receives the external control signal CNT transmitted from the memory controller 2, and transfers the command and the address information in the external control signal CNT to the sequencer 15.

The sequencer 15 controls the memory device 1 based on the transferred command and address information. For example, the sequencer 15 controls the core circuit 11, the column decoder 12, the row decoder 13, the input/output circuit 16, and the like to execute various operations such as the write operation and the read operation.

The sequencer 15 includes a voltage generator 151. The voltage generator 151 generates various voltages used for the write operation, the read operation, and the like. The sequencer 15 supplies the voltages generated by the voltage generator 151 to the core circuit 11.

The input/output circuit 16 receives write data in the data signal DQ transmitted from the memory controller 2 and transfers the write data to the core circuit 11. The input/output circuit 16 also receives read data read from the core circuit 11 and temporarily holds the read data. The input/output circuit 16 transmits the read data to the memory controller 2.

The column decoder 12 receives the address information from the sequencer 15. The column decoder 12 generates a signal related to selection of a bit line based on the address Information and transmits the signal to the core circuit 11.

The row decoder 13 receives the address information from the sequencer 15. The row decoder 13 generates a signal related to selection of a word line based on the address information and transmits the signal to the core circuit 11.

(2) Core Circuit

FIG. 2 is a block diagram illustrating an example of a configuration of the core circuit 11 of the memory device 1 according to the first embodiment.

The core circuit 11 includes a memory cell array MCA, a column transfer switch group CTS, a write driver CWD, a precharge circuit CPC, a sense amplifier SA, a row transfer switch group RTS, a write driver RWD, a precharge circuit RPC, and a read sink RS.

The memory cell array MCA includes the above-described plurality of memory cells.

The write driver CWD, the precharge circuit CPC, the sense amplifier SA, and the column transfer switch group CTS are coupled to a global bit line GBL. The column transfer switch group CTS is coupled to a plurality of memory cells in the memory cell array MCA via a plurality of bit lines. A single memory cell is coupled to a single bit line.

For example, the column transfer switch group CTS receives a signal related to the selection of a bit line from the column decoder 12, and electrically couples the bit line coupled to the memory cell, which is a target of the operation executed by the memory device 1, and the global bit line GBL based on the signal.

The write driver CWD controls a current flowing through the global bit line GBL during the write operation. The current flows through the memory cell, which is a target of the write operation. Thus, the write data received by the input/output circuit 16 and transferred to the core circuit 11 can be written to the write target memory cell.

The precharge circuit CPC applies a certain voltage supplied from the sequencer 15 to the global bit line GBL, for example, during the read operation. The voltage is transmitted to, for example, a bit line BL coupled to the memory cell, which is a target of the read operation.

The sense amplifier SA applies a voltage based on the certain voltage supplied from the sequencer 15 to the global bit line GBL, for example, during the read operation. The voltage is transmitted to, for example, a bit line BL coupled to the memory cell, which is a target of the read operation. Further, the sense amplifier SA detects the voltage related to the memory cell, which is a target of the read operation, via the global bit line GBL during the read operation. Thus, the sense amplifier SA reads data stored in the memory cell and transmits the read data to the input/output circuit 16.

The write driver RWD, the precharge circuit RPC, the read sink RS, and the row transfer switch group RTS are coupled to the global word line GWL. The row transfer switch group RTS is coupled to a plurality of memory cells in the memory cell array MCA via a plurality of word lines. A single memory cell is coupled to a single word line.

For example, the row transfer switch group RTS receives a signal related to the selection of a word line from the row decoder 13, and electrically couples the word line coupled to the memory cell, which is a target of the operation executed by the memory device 1, and the global word line GWL based on the signal.

The write driver RWD controls a current flowing through the global word line GWL during the write operation. The current flows through the memory cell, which is a target of the write operation.

The precharge circuit RPC applies a certain voltage supplied from the sequencer 15 to the global word line GWL, for example, during the read operation. The voltage is transmitted to, for example, a word line WL coupled to the memory cell, which is a target of the read operation.

The read sink RS fixes the potential of the word line coupled to the memory cell, which is a target of the read operation, to, for example, a ground potential via the global word line GWL during the read operation.

(3) Memory Cell Array

FIG. 3 illustrates an example of a circuit configuration of the memory cell array MCA of the memory device 1 according to the first embodiment. In FIG. 3, in addition to the circuit configuration of the memory cell array MCA, an example of the circuit configurations of the column transfer switch group CTS and the row transfer switch group RTS is also illustrated.

First, the circuit configurations of the column transfer switch group CTS and the row transfer switch group RTS will be described.

The column transfer switch group CTS includes transistors CTr0, CTr1, . . . , and CTr(m−1) (m is an integer of 1 or more). Each of these transistors is, for example, a field effect transistor (FET) such as an n-channel metal oxide semiconductor (MOS) transistor. The same applies to components referred to as transistors in the present specification, unless otherwise specified.

A first end of the transistor CTr0 is coupled to the global bit line GBL, and a second end of the transistor CTr0 is coupled to a bit line BL0. A first end of the transistor CTr1 is also coupled to the global bit line GBL, and a second end of the transistor CTr1 is coupled to a bit line BL1. The same applies hereinafter, and finally, a first end of a transistor CTr(m−1) is also coupled to the global bit line GBL, and a second end of the transistor CTr(m−1) is coupled to a bit line BL(m−1). In this manner, the first ends of the transistors CTr0 to CTr(m−1) are commonly coupled to the global bit line GBL, and the second ends of the transistors CTr0 to CTr(m−1) are respectively coupled to the bit lines BL0 to BL(m−1) in a one-to-one relationship.

For example, voltages based on a signal related to selection of a bit line are applied to control gates (hereinafter, also referred to as gates or a control ends) of the transistors CTr0 to CTr (m−1). Thus, the bit line BL coupled to the memory cell, which is a target of the operation executed by the memory device 1, and Che global bit line GBL are electrically coupled.

The row transfer switch group RTS includes transistors RTr0, RTr1, . . . , and RTr(n−1) (n is an integer of 1 or more).

A first end of the transistor RTr0 is coupled to the global word line GWL, and a second end of the transistor RTr0 is coupled to a word line WL0. A first end of the transistor RTr1 is also coupled to the global word line GWL, and a second end of the transistor RTr1 is coupled to a word line WL1. The same applies hereinafter, and finally, a first end of a transistor RTr(n−1) is also coupled to the global word line GWL, and a second end of the transistor R7r(n−1) is coupled to a word line WL(n−1). In this manner, the first ends of the transistors RTr0 to RTr(n−1) are commonly coupled to the global word line GWL, and the second ends of the transistors RTr0 to RTr(n−1) are respectively coupled to the word lines WL0 to WL(n−1) in a one-to-one relationship.

For example, voltages based on a signal related to selection of a word line are applied to gates of the transistors RTr0 to RTr(n−1). Thus, the word line WL coupled to the memory cell, which is a target of the operation executed by the memory device 1, and the global word line GWL are electrically coupled.

Next, a circuit configuration of the memory cell array MCA will be described.

The memory cell array MCA includes a plurality of memory cells MC. The coupling relationship of these memory cells MC is as described below. That is, for each combination of a single bit line BL of the bit lines BL0 to BL(m−1) and a single word line WL of the word lines WL0 to WL(n−1), a single memory cell MC is coupled between the bit line BL and the word line WL. Note that, hereinafter, the word line WL and the bit line BL coupled to a certain memory cell MC are also respectively referred to as a word line WL and a bit line BL corresponding to the memory cell MC.

FIG. 4 illustrates an example of a part of a structure of the memory cell array MCA of the memory device 1 according to the first embodiment.

A plurality of word lines WL is provided in a certain interconnect (or, wiring) layer. Each word line WL extends in a first direction D1. The plurality of word lines WL is sequentially provided so as to be adjacent to each other with intervals along a second direction D2. The second direction D2 intersects with the first direction D1 and is, for example, orthogonal to the first direction D1.

A plurality of bit lines BL is provided in another interconnect layer. Each bit line BL extends, for example, in the second direction D2. For example, the plurality of bit lines BL is sequentially provided so as to be adjacent to each other with intervals along the first direction D1.

For each combination of a single word line WL and a single bit line BL, a single memory cell MC coupled to the word line WL and the bit line BL is provided between the word line WL and the bit line BL.

The memory cell MC includes an MTJ element (in the drawing, reference symbol MTJ is given) and a switching element S stacked along a third direction D3. For example, the third direction D3 intersects with the first direction D1 and the second direction D2, and is, for example, orthogonal to the first direction and the second direction. The MTJ element is coupled to, for example, the word line WL, and the switching element S is coupled to, for example, the bit line BL.

Although FIG. 4 illustrates an example of a part of the structure of the memory cell array MCA, either the interconnect layer in which the word line WL is provided or the interconnect layer in which the bit line BL is provided may be provided on the upper layer. FIG. 4 illustrates an example in which regarding the MTJ element and the switching element S included in the memory cell MC, the MTJ element is provided on the word line WL side and the switching element S is provided on the bit line BL side. The present embodiment is not limited to the above. The MTJ element may be provided on the bit line BL side, and the switching element S may be provided on the word line WL side.

(4) Memory Cell

Hereinafter, a configuration of a certain memory cell of the memory device 1 according to the first embodiment will be described. Hereinafter, a single memory cell MC will be described as an example, but the same description holds for each of the other memory cells MC.

FIG. 5 is a cross-sectional diagram illustrating an example of a configuration of a certain memory cell MC of the memory device 1 according to the first embodiment.

As already described with reference to FIG. 4, the memory cell MC includes the MTJ element, which is a variable resistance element, and the switching element S. For example, a first end of the switching element S is coupled to the bit line BL, a second end of the switching element S is coupled to a first end of the MTJ element, and a second end of the MTJ element is coupled to the word line WL.

The switching element S is, for example, a switching element between two terminals. When a voltage applied between the two terminals is less than a threshold value, the switching element is in an off state, for example, an electrically high resistance state. When a voltage applied between the two terminals is equal to or more than the threshold value, the switching element is in an on state, for example, an electrically low resistance state. The switching element may have this function regardless of the polarity of the voltage.

As the switching element in the present embodiment a switching element having a characteristic that the resistance value rapidly decreases at a certain voltage, and accordingly, the applied voltage rapidly decreases and the current increases (snaps back) will be described as an example. Note that the material used for the switching element having such characteristic is appropriately selected and used according to the characteristics of the memory cell. An operation will be described later.

The MTJ element includes a ferromagnet (ferromagnetic layer) SL, a nonmagnet (nonmagnetic layer) TB, and a ferromagnet (ferromagnetic layer) RL. The three layers: the ferromagnet SL, the nonmagnet TB, and the ferromagnet RL are stacked in the order of, for example, the ferromagnet SL, the nonmagnet TB, and the ferromagnet RL from the first end side toward the second end side of the MTJ element.

The nonmagnet TB functions as, for example, a tunnel barrier layer. That is, the ferromagnet SL, the nonmagnet TB, and the ferromagnet RL form a magnetic tunnel junction. The ferromagnet RL has fixed magnetization in a certain direction and functions as, for example, a reference layer. Here, the "fixed magnetization" means that the magnetization direction does not change by a current (spin torque) of a magnitude that can switch the magnetization direction of the ferromagnet SL. The ferromagnet SL is a ferromagnetic layer having a variable magnetization direction and functions as a storage layer. Here, the "variable magnetization" means that, the magnetization direction changes by a current (spin torque) of a magnitude that can switch the magnetization direction of the ferromagnet SL.

The set of the ferromagnet SL, the nonmagnet TB, and the ferromagnet RL exhibits the TMR effect. The TMR effect refers to a phenomenon in which a structure including two ferromagnets sandwiching an insulator exhibits different resistance values depending on whether the magnetization directions of the two ferromagnets are parallel or antiparallel. When the magnetization directions of the two ferromagnets are parallel, the structure exhibits a resistance value lower than a resistance value when the magnetization directions of the two ferromagnets are antiparallel.

In a case where the magnetization direction of the ferromagnet RL and the magnetization direction of the ferromagnet SL are parallel, the resistance value of the MTJ element is lower than that in a case where the two magnetization directions are antiparallel. That is, the MTJ element is set as a low resistance state LRS. The low resistance state LRS is also referred to as a "parallel (P) state". For example, it is defined that data "0" is stored in the memory cell MC including the MTJ element in the low resistance state LRS.

In a case where the magnetization direction of the ferromagnet RL and the magnetization direction of the ferromagnet SL are antiparallel, the resistance value of the MTJ element is higher than that in a case where the two magnetization directions are parallel. That is, the MTJ element is set as a high resistance state HRS. The high resistance state HRS is also referred to as an "anti-parallel (AP) state". For example, it is defined that data "1" is stored in the memory cell MC including the MTJ element in the high resistance state HRS.

In the following description, for the purpose of conciseness of description, it is assumed that when the MTJ element is in the low resistance state LRS, the memory cell MC including the MTJ element is also in the low resistance state LRS, and when the MTJ element is in the high resistance state HRS, the memory cell MC including the MTJ element is also in the high resistance state HRS.

The MTJ element illustrated in FIG. 5 is merely an example, and the MTJ element may include further layers other than those described above. In addition, the coupling relationship between the MTJ element and the switching element S illustrated in RIG. 5 is also merely an example, and the present embodiment is not limited thereto. For example, the order of stacking of the ferromagnet SL, the nonmagnet TB, and the ferromagnet RL of the MTJ element may be opposite to that described above. In addition, the order in which the switching element S and the MTJ element are coupled between the bit line BL and the word line WL may be opposite to that described above.

Next, the ferromagnet SL, the nonmagnet TB, and the ferromagnet RL will be further described. The nonmagnet TB exhibits, for example, insulating properties and includes a nonmagnetic material. For example, the nonmagnet TB includes oxygen and magnesium or magnesium oxide (MgO).

The ferromagnet SL has conductivity and includes a ferromagnetic material. For example, the ferromagnet SL includes iron cobalt boron (FeCoB) or iron boride (FeB).

The ferromagnet RL has conductivity and includes a ferromagnetic material having an easy magnetization axis along a direction perpendicular to an interface between the ferromagnet RL and another layer. For example, the ferromagnet RL includes iron cobalt boron (FeCoB) as a ferromagnet having perpendicular magnetization. The ferromagnet RL may include at least one of cobalt platinum (CoPt), cobalt nickel (CoNi), and cobalt palladium (CoPd).

The magnetization direction of the ferromagnet RL is fixed and faces either the direction on the ferromagnet SL side or the opposite direction (in the example of FIG. 5, it faces the opposite side of the ferromagnet SL side).

The magnetization direction of the ferromagnet SL can be switched along the easy magnetization axis, and data is written in the memory cell MC by switching the magnetization direction of the ferromagnet SL. For this purpose, a spin-injection writing method can be applied to the memory device 1. In the spin-injection writing method, a write current is applied to the MTJ element, and the magnetization direction of the ferromagnet SL is controlled by the write current. That is, the spin transfer torque (STT) effect generated by the write current is used.

When a write current is applied to the MTJ element in the direction of the arrow A1 illustrated in FIG. 5, that is, in the direction from the ferromagnet SL toward the ferromagnet RL, the magnetization direction of the ferromagnet SL becomes parallel with respect to the magnetization direction of the ferromagnet RL. When a write current is applied to the MTJ element in the direction of the arrow A2 illustrated in FIG. 5, that is, in the direction from the ferromagnet RL toward the ferromagnet SL, the magnetization direction of the ferromagnet SL becomes antiparallel with respect to the magnetization direction of the ferromagnet RL.

Figure 6:
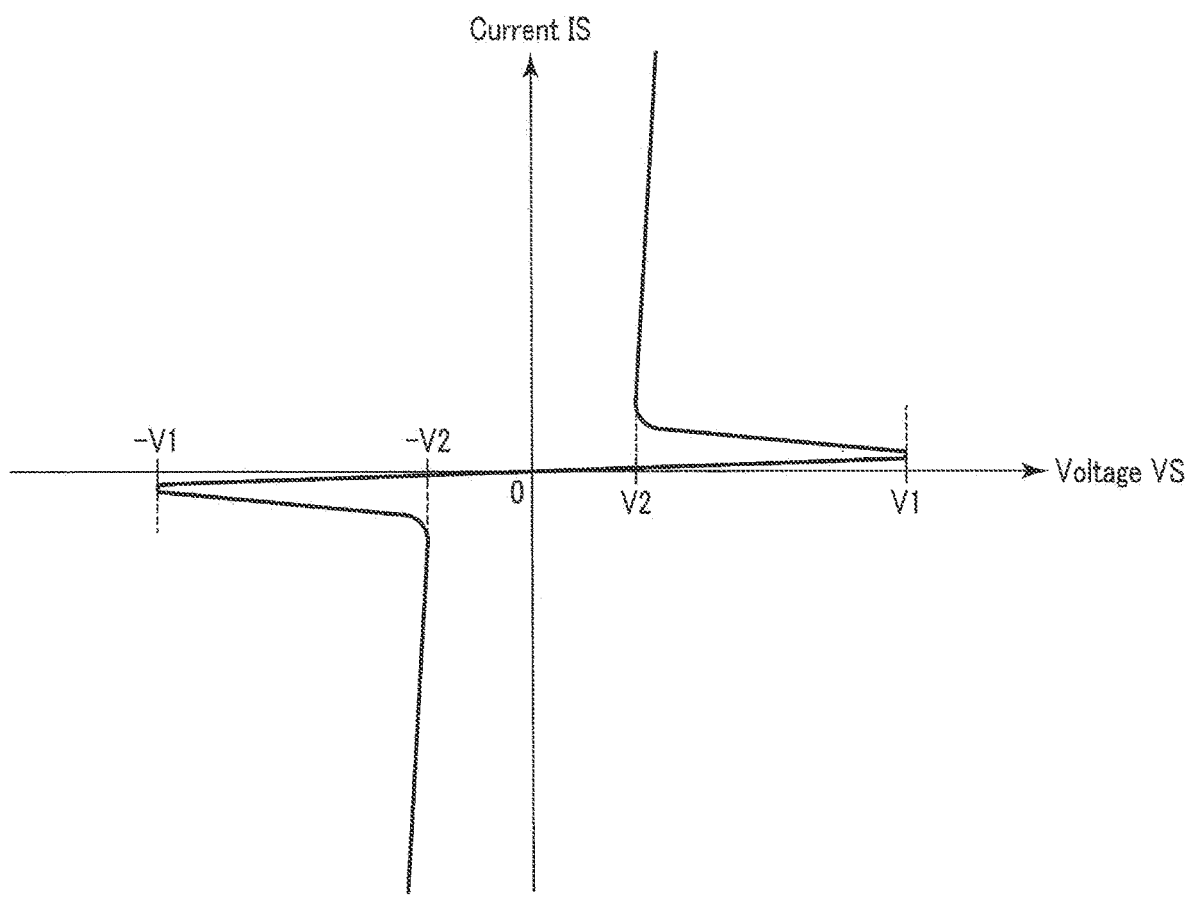
FIG. 6 is a diagram illustrating an example of a graph indicating a current-voltage (I-V) characteristic of a switching element of the memory cell.

FIG. 6 illustrates an example of a graph indicating a current-voltage (I-V) characteristic of the switching element S of the memory cell MC. The horizontal axis of the graph indicates voltage VS applied to the switching element S. The vertical axis of the graph indicates current IS flowing through the switching element S. The current IS flowing in a certain direction is defined as a positive current, and the voltage applied to the switching element S to cause the current IS in the certain direction to flow is defined as a positive voltage.

For example, a case where the voltage applied to the memory cell MC is changed so that the voltage VS gradually increases from zero volt (V) will be described.

The current IS continuously increases until the voltage VS reaches voltage V1. When the voltage VS reaches the voltage V1, the switching element S changes from the off state to the on state, and the magnitude of the resistance of the MTJ element becomes dominant in the resistance of the entire memory cell MC. Therefore, the magnitude of the voltage applied to the switching element S decreases, and for example, the voltage VS transitions from the voltage V1 to positive voltage V2. On the other hand, when the switching element turns into the on state, the current IS rapidly increases. The voltage VS and the current IS at this time can also be regarded as following a negative resistance region in the graph of FIG. 6. For example, the sense amplifier SA does not detect the current IS before the rapid increase, but can detect the current IS after the rapid increase.

Subsequently, in a case where the voltage applied to the memory cell MC is changed so as to lower the voltage VS, when the voltage VS reaches the voltage V2, the switching element S changes from the on state to the off state, and the current IS rapidly decreases. For example, the sense amplifier SA does not detect the current IS after the rapid decrease.

As illustrated in the graph of FIG. 6, when the positive and negative of the voltage VS applied to the switching element S are reversed, the positive and negative of the current IS are reversed. That is, the switching element S has I-V characteristics symmetrical to each other in both directions (positive direction and negative direction).

Figure 7:
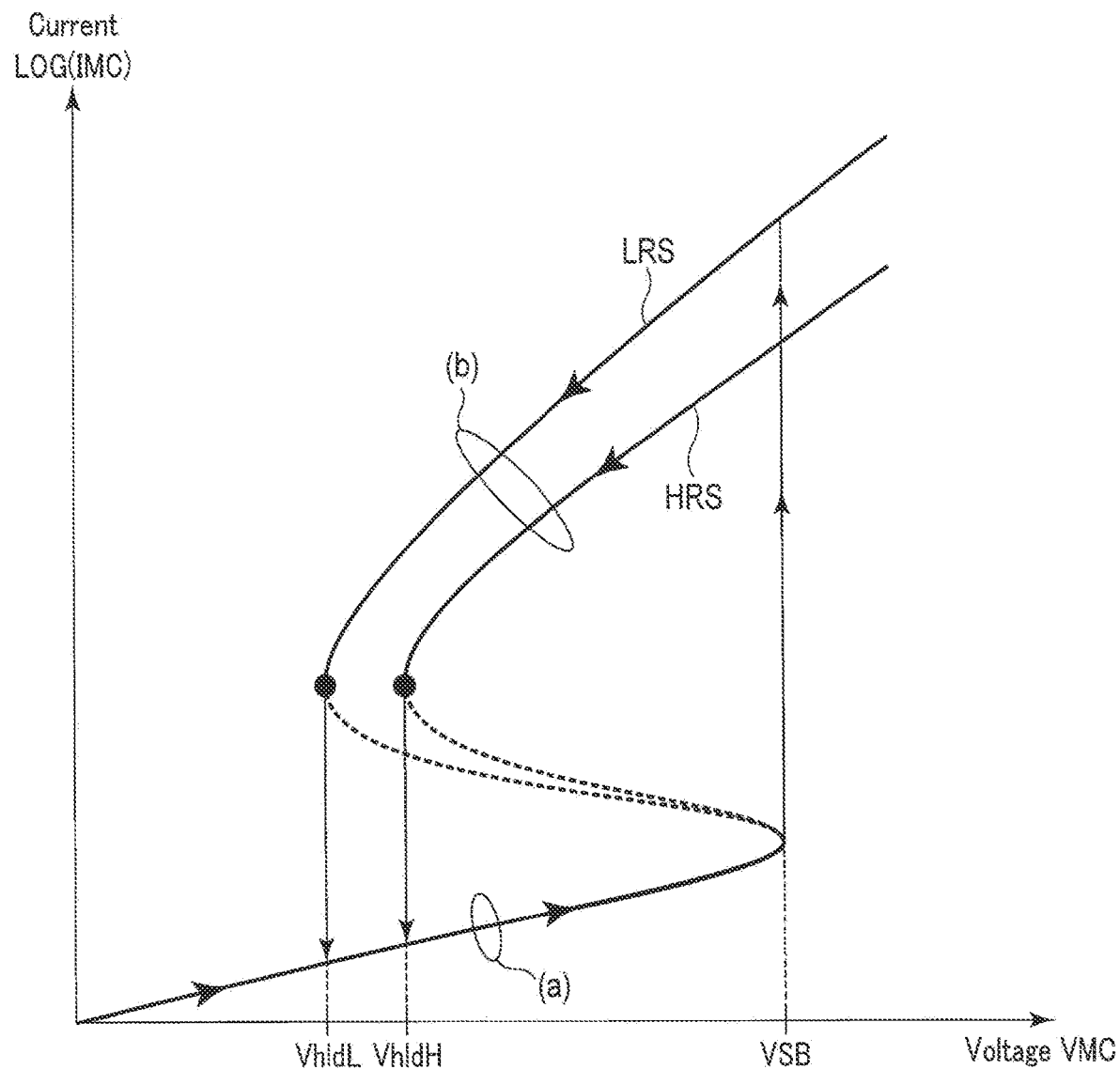
FIG. 7 is a diagram illustrating an example of a graph indicating an I-V characteristic of the memory cell.

FIG. 7 illustrates an example of a graph indicating the I-V characteristic of the memory cell MC. The horizontal axis of the graph indicates voltage VMC having a magnitude of the voltage applied to the memory cell MC (the potential difference between the corresponding bit line BL and word line WL). The vertical axis of the graph indicates current IMC having a magnitude of a cell current flowing through the memory cell MC on a Log scale. Portions indicated by the broken lines in the graph of FIG. 7 indicate a virtual characteristic that does not actually appear.

First, the following description holds for both the case where the memory cell MC is in the high resistance state HRS and the case where the memory cell MC is in the low resistance state LRS.

When the voltage VMC is gradually increased, the current IMC continuously increases until the voltage VMC reaches voltage VSB (region of (a) illustrated in FIG. 7). When the voltage VMC is further increased, the function of the graph has discontinuity on the point that the voltage VMC is the voltage VSB. That is, when the voltage VMC reaches the voltage VSB, the current IMC rapidly increases. After such a rapid increase in the current IMC, the current IMC continuously changes with respect to any change in magnitude of the voltage VMC, and the larger the voltage VMC, the larger the current IMC (region of (b) illustrated in FIG. 7). For example, the sense amplifier SA does not detect the current IMC before the rapid increase, but can detect the current IMC after the rapid increase.

Next, a case where the memory cell MC is in the high resistance state HRS and a case where the memory cell MC is in the low resistance state LRS will be described in comparison.

Before the above rapid increase in the current IMC, the current IMC is substantially the same when the memory cell MC is in the low resistance state LRS and when the memory cell MC is in the high resistance state HRS. This is because of the reason described below.

The above rapid increase in the current IMC is caused by the switching element S in the memory cell MC transitioning from the off state to the on state, thereby becoming conductive. Before the rapid increase in the current IMC, the switching element S is in the off state, and therefore the resistance of the switching element S is much greater than the resistance of the MTJ element. Therefore, before the rapid increase in the current IMC, the magnitude of the resistance of the switching element S is dominant in the resistance of the entire memory cell MC, and the resistance of the memory cell MC is substantially the same between the case where the memory cell MC is in the low resistance state LRS and the case where the memory cell MC is in the high resistance state HRS.

On the other hand, after the above rapid increase in the current IMC, the current IMC when a certain voltage is applied to the memory cell MC is larger when the MTJ element is in the low resistance state LRS than when the MTJ element is in the high resistance state HRS. This is because the magnitude of the resistance of the MTJ element is dominant in the resistance of the entire memory cell MC while the switching element S is in the on state.

A case where the voltage VMC decreases after the rapid increase in the current IMC will be described. When the voltage VMC is decreased, the function of the graph has discontinuity on the point the voltage VMC is a certain voltage as will be described below.

When the memory cell MC is in the low resistance state LRS, the current IMC rapidly decreases when the voltage VMC reaches voltage $Vh1dL$. On the other hand, when the memory cell MC is in the high resistance state HRS, the current IMC rapidly decreases when the voltage VMC reaches voltage $Vh1dH$. The voltages $Vh1dL$ and $Vh1dH$ are each smaller than the voltage VSB. The voltage $Vh1dH$ is larger than the voltage $Vh1dL$. After such a rapid decrease in the current IMC, the current IMC changes according to the I-V characteristic on which the current IMC is based before the rapid increase in the current IMC described above (region of (a) illustrated in FIG. 7). This means that the switching element S has changed from the on state to the off state. For example, the sense amplifier SA does not detect the current IMC after the rapid decrease.

(5) Circuit Related to Application of Voltage to Memory Cell

Figure 8:
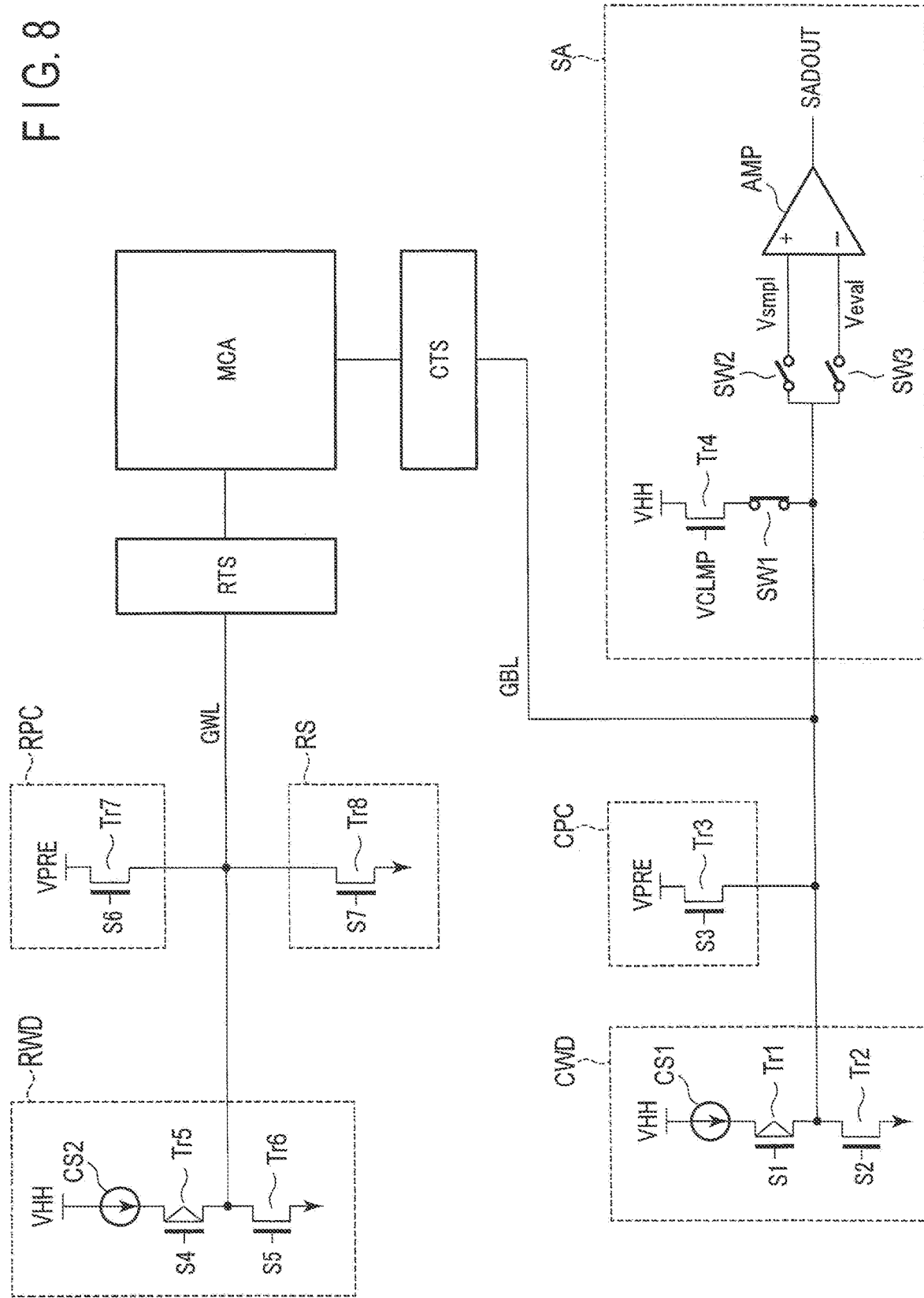
FIG. 8 is a diagram illustrating an example of a circuit configuration of each of a certain write driver, a certain precharge circuit, a sense amplifier, another write driver, another precharge circuit, and a read sink of the memory device according to the first embodiment.

FIG. 8 illustrates an example of a circuit configuration of each of the write driver CWD, the precharge circuit CPC, the sense amplifier SA, the write driver RWD, the precharge circuit RPC, and the read sink RS of the memory device 1 according to the first embodiment. The circuit configuration described below is merely an example, and another circuit configuration that realizes equivalent functions may be used. In the following description, a certain memory cell MC, which is a target of the read operation or the write operation, is also referred to as a selected memory cell MC.

The write driver CWD includes, for example, a current source CS1, a transistor Tr1, and a transistor Tr2. The transistor Tr1 is, for example, a p-channel MOS transistor.

Voltage VHH is applied to an input end of the current source CS1, and an output end of the current source CS1 is coupled to a first end of the transistor Tr1. The voltage VHH is supplied by, for example, an external power supply.

A second end of the transistor Tr1 is coupled to the global bit line GBL. A control signal S1 is input to a gate of the transistor Tr1. The control signal S1 is supplied by, for example, the sequencer 15. The same applies to other control signals described to be input to a gate of a certain transistor Tr in the following description.

A first end of the transistor Tr2 is coupled to the global bit line GBL, and a second end of the transistor Tr2 is, for example, grounded. A control signal S2 is input to a gate of the transistor Tr2. Each component described as being grounded in the present specification is not necessarily grounded, and it is sufficient if, for example, each component is at a low reference potential among several reference potentials used in the memory device 1.

The precharge circuit CPC includes, for example, a transistor Tr3. Voltage VPRE is applied to a first end of the transistor Tr3, and a second end of the transistor Tr3 is coupled to the global bit line GBL. A control signal S3 is input to a gate of the transistor Tr3. The voltage VPRE is supplied by, for example, an external power supply or the voltage generator 151.

The sense amplifier SA includes, for example, a transistor Tr4, switches SW1, SW2, and SW3, and an operational amplifier circuit AMP.

For example, voltage VHH is applied to a first end of the transistor Tr4, and a second end of the transistor Tr4 is coupled to a first end of the switch SW1. Voltage VCLMP is applied to a gate of the transistor Tr4. For example, the voltage VHH is supplied by an external power supply, and the voltage VCLMP is supplied by the voltage generator 151. For example, a voltage applied to the bit line BL corresponding to the selected memory cell MC in the read operation is determined by the voltage VHH and the voltage VCLMP.

A second end of the switch SW1 is coupled to the global bit line GBL. The switch SW1 is, for example, a switching element between two terminals, and can transfer a voltage between the first end and the second end while the switch SW1 is in the on state. The switch SW1 is, for example, a field effect transistor such as an n-channel MOS transistor. In the present specification, description will be made assuming that the switch SW1 is an n-channel MOS transistor. The same applies to the other switches SW unless otherwise specified.

A certain control signal is input to a control gate (hereinafter, also referred to as a gate or a control end) of the switch SW1. The control signal is supplied by, for example, the sequencer 15. The same applies to other control signals described to be input to a gate of a certain switch SW in the following description.

A first end of the switch SW2 is coupled to the global bit line GBL, and a second end of the switch SW2 is coupled to a non-inverting input terminal of the operational amplifier circuit AMP. A certain control signal is input to a gate of the switch SW2. Reference symbol Vsmp1 illustrated in FIG. 8 will be referred to in the description of the operation example.

A first end of the switch SW3 is coupled to the global bit line GBL, and a second end of the switch SW3 is coupled to an inverting input terminal of the operational amplifier circuit AMP. A certain control signal is input to a gate of the switch SW3. Reference symbol Veva1 illustrated in FIG. 8 will be referred to in the description of the operation example.

The operational amplifier circuit AMP amplifies the voltage applied to the non-inverting input terminal based on the voltage applied to the inverting input terminal, and outputs a signal SADOUT, which is a result of the amplification. The read data is based on the signal SADOUT.

The write driver RWP includes, for example, a current source CS2, a transistor Tr5, and a transistor Tr6. The transistor Tr5 is, for example, a p-channel MOS transistor.

For example, voltage VHH is applied to an input end of the current source CS2, and an output end of the current source CS2 is coupled to a first end of the transistor Tr5. The voltage VHH is supplied by, for example, an external power supply.

A second end of the transistor Tr5 is coupled to the global word line GWL. A control signal S4 is input to a gate of the transistor Tr5.

A first end of the transistor Tr6 is coupled to the global word line GWL, and a second end of the transistor Tr6 is, for example, grounded. A control signal S5 is input to a gate of the transistor Tr6.

The precharge circuit RPC includes, for example, a transistor Tr7. For example, voltage VPRE is applied to a first end of the transistor Tr7, and a second end of the transistor Tr7 is coupled to the global word line GWL. A control signal S6 is input to a gate of the transistor Tr7. The voltage VPRE is supplied by, for example, an external power supply or the voltage generator 151.

The read sink RS includes, for example, a transistor Tr8. A first end of the transistor Tr8 is coupled to the global word line GWL, and a second end of the transistor Tr8 is, for example, grounded. A control signal S7 is input to a gate of the transistor Tr8.

[Operation Example]

Hereinafter, an operation example in which the memory device 1 according to the first embodiment executes a certain read operation will be described. The read operation may also be referred to as, for example, a self-reference read operation.

Figure 9:
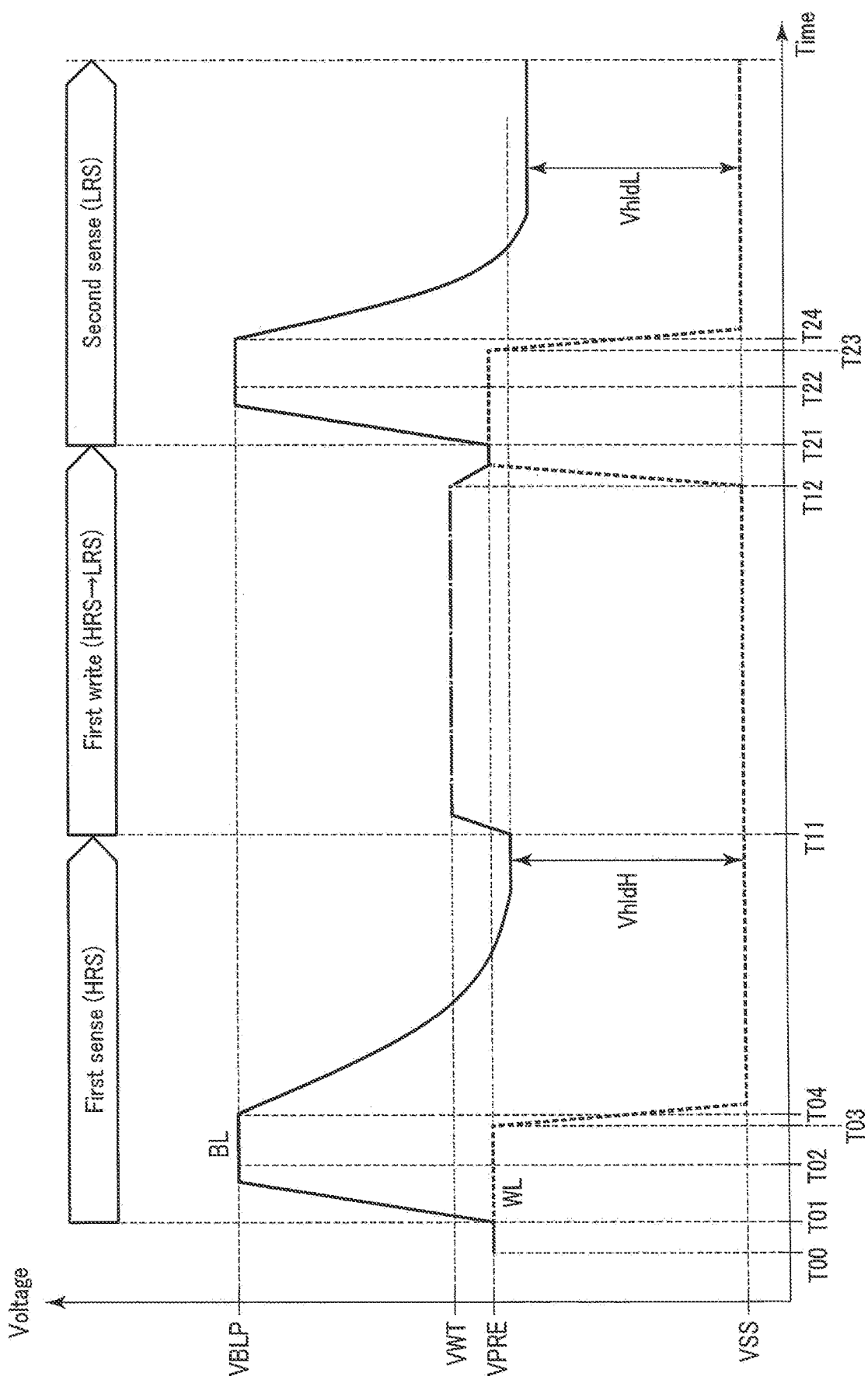
FIG. 9 is a diagram illustrating an example of a timing chart illustrating temporal changes in voltages applied to a bit line and a word line corresponding to a selected memory cell when the memory device according to the first embodiment executes a certain read operation.

FIG. 9 illustrates an example of a timing chart illustrating temporal changes in voltages applied to the bit line BL and the word line WL corresponding to the selected memory cell MC when the memory device 1 according to the first embodiment executes the read operation. The bit line BL and the word line WL mentioned in the description of the operation example are the bit line BL and the word line WL corresponding to the selected memory cell MC, respectively. The read operation described below is merely an example, and the read operation according to the present embodiment is not limited thereto.

In the read operation, the first sense operation, a first write operation, and the second sense operation are sequentially executed on the selected memory cell MC, and the data stored in the selected memory cell MC at the start of the first sense operation is determined after the second sense operation. A second write operation can also be executed based on the determination result.

In the following description, in a case where control of a voltage applied to a certain interconnect is described, unless it is explicitly described that another control is performed on the interconnect thereafter, the control described with respect to the interconnect is continued.

The application of the voltage to the word line WL in the following description is realized by, for example, control of the row decoder 13, the write driver RWD, the precharge circuit RPC, the read sink RS, and the row transfer switch group RTS by the sequencer 15. The application of the voltage to the bit line BL is realized by, for example, control of the column decoder 12, the write driver CWD, the precharge circuit CPC, the sense amplifier SA, and the column transfer switch group CTS by the sequencer 15.

At time T00 before the start of the read operation, the voltage VPRE is applied to each of the bit line BL and the word line WL. The application of the voltage VPRE is enabled by turning the transistors Tr3 and Tr7 of the precharge circuits CPC and RPC to the on state.

First, control executed in the first sense operation will be described.

At time T01, the voltage applied to the bit line BL is increased from the voltage VPRE to voltage VBLP while the voltage VPRE is applied to the word line WL. The voltage VBLP can be applied by turning the switch SW1 of the sense amplifier SA into the on state. A difference between the voltage VBLP and the voltage VPRE is smaller than the voltage VSB (FIG. 7).

After the potential (hereinafter, also referred to as the voltage) of the bit line BL by the application of the voltage VBLP stabilizes, the switch SW1 of the sense amplifier SA is turned into the off state and the bit line BL is in a floating state at time T02.

Subsequently, at time T03, the voltage applied to the word line WL is lowered from the voltage VPRE to voltage VSS while the bit line BL remains in the floating state. The voltage VSS can be applied by turning the transistor Tr8 of the read sink RS into the on state. The voltage VSS is, for example, a ground voltage.

While the voltage of the word line WL decreases by the application of the voltage VSS, the voltage difference between the bit line BL and the word line WL exceeds the voltage VSB. As described above, when the voltage difference reaches the voltage VSB, the switching element S in the selected memory cell MC changes from the off state to the on state and becomes conductive, and the cell current flowing through the selected memory cell MC rapidly increases. The cell current flows out from the bit line BL via the word line WL and the transistor Tr8 of the read sink RS. Thus, the voltage of the bit line BL decreases. In FIG. 9, the time of the start of the decrease is indicated as time T04.

The decrease in the voltage of the bit line BL leads to a decrease in the voltage difference between the bit line BL and the word line WL. In a case where the selected memory cell MC is, for example, in the high resistance state HRS, when the voltage difference decreases to reach the voltage Vh1$d$H (FIG. 7), the cell current rapidly decreases, and thus the voltage of the bit line BL stabilizes. That is, the voltage of the bit line BL stabilizes at a voltage higher by the voltage Vh1$d$H than the voltage of the word line WL to which the voltage VSS is applied. Hereinafter, a case where the selected memory cell MC is in the high resistance state HRS at the start of the first sense operation will be described.

The control executed in the subsequent first write operation will be described.

At time T11, for example, the write current supplied from the current source CS1 of the write driver CWD is controlled to flow through the bit line BL, the selected memory cell MC, and the word line WL in the order of appearance. This is enabled when the transistor Tr1 of the write driver CWD is turned into the on state and the transistor Tr2 is turned into the off state, and the transistor Tr6 of the write driver RWD is turned into the on state and the transistor Tr5 is turned into the off state. The write current functions as a write current flowing in the direction A1 of the example of FIG. 5, and thus, the MTJ element is turned into the low resistance state LRS, that is, the selected memory cell MC is turned into the low resistance state LRS. FIG. 9 illustrates that the voltage of the bit line BL once becomes voltage VWT and the voltage of the word line WL is VSS when the write current flows as described above. For example, the difference between the voltage VWT and the voltage VSS is larger than the voltage VSB. The voltage of the bit line BL while the write current is flowing is illustrated as being constant in FIG. 9, but is not necessarily constant.

Subsequently, at time T12, the voltage VPRE is applied to each of the bit line BL and the word line WL. The application of the voltage VPRE is enabled by the precharge circuits CPC and RPC as described in connection with the time T00. At this time, the transistor Tr1 of the write driver CWD and the transistor Tr6 of the write driver RWD are turned into the off state.

The control executed in the subsequent second sense operation will be described.

At time T21, the voltage applied to the bit line BL is increased from the voltage VPRE to the voltage VBLP while the voltage VPRE is applied to the word line WL as described in connection with the time T01.

After the voltage of the bit line BL stabilizes by the application of the voltage VBLP, the bit line BL is in the floating state at time 722 as described in connection with the time T02.

Subsequently, at time T23, the voltage applied to the word line WL is lowered from the voltage VPRE to the voltage VSS while the bit line BL remains in the floating state as described in connection with the time T03.

While the voltage of the word line WL decreases by the application of the voltage VSS, the voltage difference between the bit line BL and the word line WL exceeds the voltage VSB. As described above, when the voltage difference reaches the voltage VSB, the voltage of the bit line BL decreases as in the first sense operation. In FIG. 9, the time of the start of the decrease is indicated as time T24.

The decrease in the voltage of the bit line BL leads to a decrease in the voltage difference between the bit line BL and the word line WL. When the voltage difference decreases to reach the voltage Vh1$d$L(FIG. 7), the cell current rapidly decreases, and thus the voltage of the bit line BL stabilizes. That is, the voltage of the bit line BL stabilizes at a voltage higher by the voltage Vh1$d$L than the voltage of the word line WL to which the voltage VSS is applied.

The control of the voltage of each of the bit line BL and the word line WL has been described above regarding each of the first sense operation and the second sense operation. When the voltage of the bit line BL is decreased as described above, the rate of decrease in the voltage of the bit line BL and the voltage of the bit line BL stabilized after the decrease are different between the first sense operation and the second sense operation. By using such a difference between the first sense operation and the second sense operation, the data stored in the selected memory cell MC at the start of the first sense operation is determined after the second sense operation. Hereinafter, the determination of the data will be described in detail.

Figure 10:
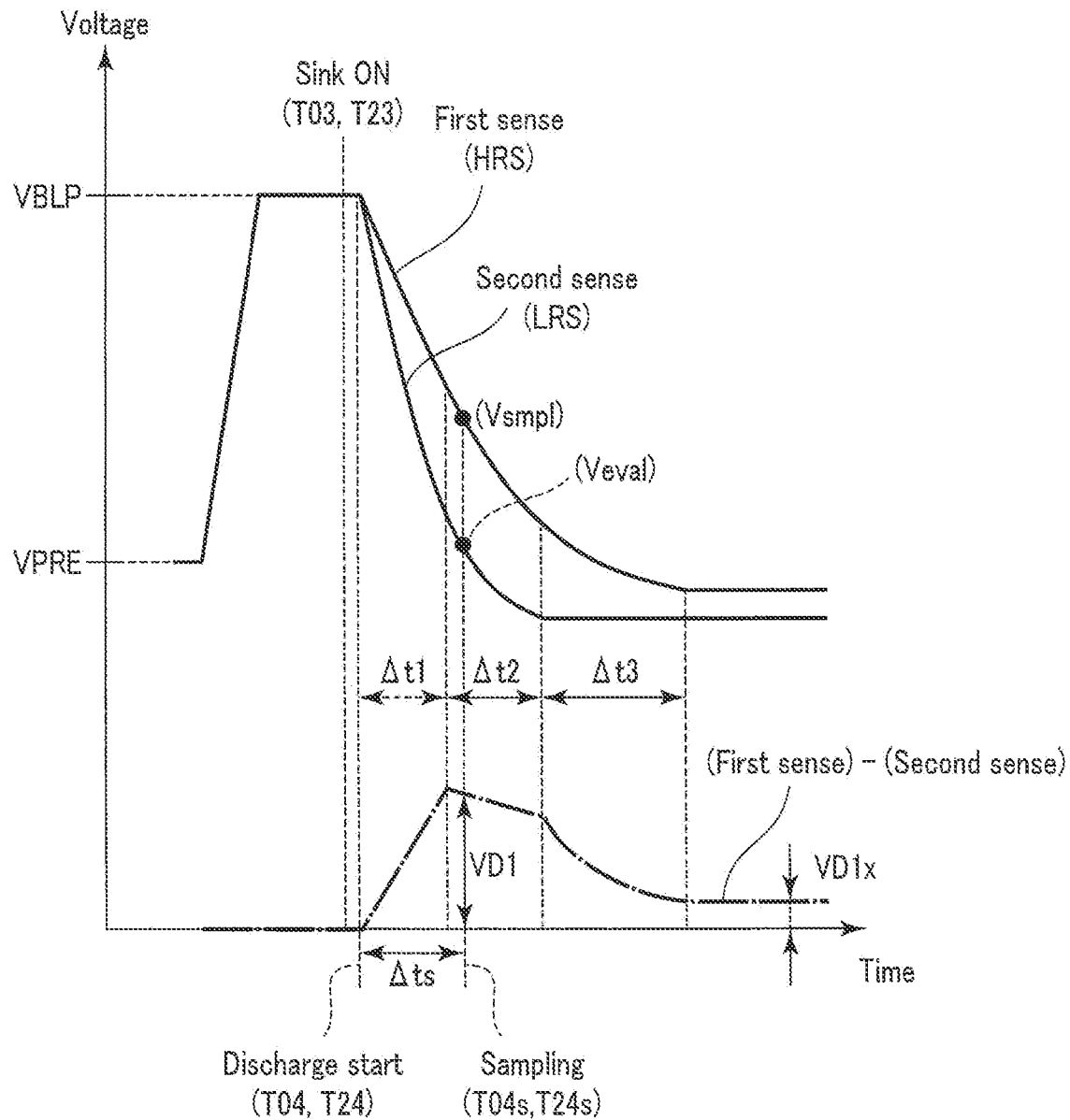
FIG. 10 is a diagram for explaining timing of voltage sampling in a first sense operation and a second sense operation by the sense amplifier of the memory device according to the first embodiment.

FIG. 10 is a diagram for explaining timing of voltage sampling in the first sense operation and the second sense operation by the sense amplifier SA of the memory device 1 according to the first embodiment.

FIG. 10 illustrates a diagram in which waveforms of voltages of the bit line BL in the first sense operation and the second sense operation illustrated in FIG. 9 are superimposed. More specifically, the two waveforms are superimposed such that times T04 and T24 at which the discharge of the bit line BL starts are at the same position on the horizontal axis. In the example of FIG. 10, the time from the time T01 to the time T03 is the same as the time from the time T21 to the time T23. The time from the time T03 to the time T04 is substantially equal to the time from the time T23 to the time T24. In FIG. 10 illustrated in this manner, the horizontal axis indicates the elapsed time from the discharge start time, and the vertical axis indicates the voltage of the bit line BL in each of the first sense operation and the second sense operation.

As illustrated in FIG. 10, the voltage of the bit line BL decreases faster in the case of the second sense operation than in the case of the first sense operation. This is because the cell current flowing through the selected memory cell MC is larger when the selected memory cell MC is in the low resistance state LRS as in the second sense operation than when the selected memory cell MC is in the high resistance state HRS as in the first sense operation. Further, the voltage of the bit line BL stabilized after the decrease is lower in the case of the second sense operation than in the case of the first sense operation. This is because the I-V characteristic of the selected memory cell MC is different between the case where the selected memory cell MC is in the high resistance state HRS and the case where the selected memory cell MC is in the low resistance state LRS as described with reference to FIG. 7.

FIG. 10 further illustrates, by the alternate long and short dash line, the state in which the difference in voltage of the bit line BL between the first sense operation and the second sense operation changes according to the elapsed time at the point of time when the same time has elapsed from the start of discharge of the bit line BL. The change in the difference in voltage described below is based on, for example, the difference in the decrease in voltage of the bit line BL as described above.

At the start of discharge, the voltages of the bit line BL in the first sense operation and the second sense operation are equal, and there is no difference between these voltages.

Until time Δt1 elapses from the start of discharge, the difference in voltage increases as the elapsed time increases.

Subsequently, until time Δt2 elapses, the difference in the voltage decreases as the elapsed time increases. At the point of time when the time of the sum of the time Δt1 and the time Δt2 has elapsed from the start of discharge, the voltage of the bit line BL in the second sense operation stabilizes.

Subsequently, until time Δt3 further elapses, the difference in the voltage further decreases as the elapsed time increases. The difference in voltage decreases at the same rate as the decrease in the voltage of the bit line BL in the first sense operation, and stabilizes at the point of time when the time of the sum of the timeΔt1. the time Δt2, end the time Δt3 elapses from the start of discharge. This is because the voltage of the bit line BL in the first sense operation stabilizes when the time of the sum of the time Δt1, the time Δt2, and the time Δt3 elapses from the start of discharge. In FIG. 10, the difference in the voltage after the stabilization is indicated as voltage difference VD1x.

In the first sense operation, the voltage of the bit line BL is sampled at a time (indicated as time T04s in FIG. 10) when time Δts elapses from the discharge start time T04. The time Δts is, for example, more than or equal to the time Δt1 and less than the time of the sum of the time Δt1, the time Δt2, and the time Δt3. FIG. 10 illustrates a case where the time Δts is more than or equal to the time Δt1 but less than the time of the sum of the time Δt1 and the time Δt2. The sampling is executed, for example, under the control of the sequencer 15, when the switch SW2 of the sense amplifier SA is turned into the on state and the switch SW3 is turned into the off state, and thus the voltage of the bit line BL is applied to the non-inverting input terminal of the operational amplifier circuit AMP. In the present specification, the voltage sampled by the first sense operation is referred to as the voltage Vsmp1. In addition, in the present specification, sampling the voltage in this manner is also referred to as sensing or detecting.

At the time when the time Δts has elapsed from the time T04, the cell current flows through the selected memory cell MC, and thus the voltage of the bit line BL is not stable. That is, the voltage Vsmp1 is sampled while the voltage of the bit line BL is changing.

In the second sense operation, the voltage of the bit line BL is sampled at a time (indicated as time T24s in FIG. 10) when time Δts elapses from the discharge start time T24. The sampling is executed, for example, under the control of the sequencer 15, when the switch SW2 of the sense amplifier SA is turned into the off state and the switch SW3 is turned into the on state, and thus the voltage of the bit line BL is applied to the inverting input terminal of the operational amplifier circuit AMP. In the present specification, the voltage sampled by the second sense operation is referred to as the voltage Veva1. The voltage Veva1 is lower than the voltage vsmp1 by a voltage difference VD1. The voltage difference VD1 is larger than the voltage difference VD1x.

In a case where the time Δts is more than or equal to the time Δt1 but less than the time of the sum of the time Δt1 and the time Δt2, when the time Δts has elapsed from the time T24, the cell current flows through the selected memory cell MC, and thus the voltage of the bit line BL is not stable. That is, the voltage Veva1 is sampled while the voltage of the bit line BL is changing.

A result of amplifying the voltage Vsmp1 of the non-inverting input terminal based on the voltage Veva1 of the inverting input terminal is reflected in the signal SADOUT output from the operational amplifier circuit AMP, and the voltage of the signal SADOUT becomes a high (H) level.

The fact that the voltage of the signal SADOUT is at the H level means that the data stored in the selected memory cell MC is different between the start of the first sense operation and the second sense operation. Therefore, for example, the sequencer 15 determines that the data "1" different from the data "0" stored during the second sense operation is stored in the selected memory cell MC at the start of the first sense operation based on the fact that the voltage of the signal SADOUT is at the H level. As a result, in the read operation described with reference to FIGS. 9 and 10, the data "1" is read. On the other hand, for example, the sequencer 15 executes the second write operation of causing the data "1" stored at the start of the first sense operation to be stored again in the selected memory cell MC according to the determination.

In the above, it has been described that, the time Δts is, for example, more than or equal to the time Δt1 and less than the time of the sum of the time Δt1, the time Δt2, and the time Δt3. For example, the time Δts may be less than the time Δt1 as long as the difference in the voltage of the bit line BL at the point of time when the time Δts has elapsed from the start of discharge of the bit line BL in each of the first sense operation and the second sense operation is larger than the voltage difference VD1ac.

In the above, the case where the selected memory cell MC is in the high resistance state HRS at the start of the first sense operation has been described. A case where the selected memory cell MC is in the low resistance state LRS at the start of the first sense operation will also be briefly described.

In this case, the decrease in the voltage of the bit line BL in the first sense operation is substantially the same as the decrease in the voltage of the bit line BL in the second sense operation. As a result, the voltage Vsmp1 sampled by the first sense operation is substantially the same as the voltage Veva1. As a result of the voltage Vsmp1 being substantially the same as the voltage Veva1 and the offset voltage being taken into account, the voltage of the signal SADOUT becomes a low (L) level. For example, the sequencer 15 determines that the data "0" stored during the second sense operation is also stored in the selected memory cell MC at the start of the first sense operation based on the fact that the voltage of the signal SADOCT is at the L level. As a result, the data "0" is read.

In the above, the case where the control for turning the selected memory cell MC into the low resistance state LRS is executed as the first write operation has been described. However, the present embodiment is not limited to the above. The technology disclosed in the present specification is also applicable to a case where control for turning the selected memory cell MC into the high resistance state HRS is executed as the first write operation.

[Advantageous Effects]

In the read operation, the memory device 1 according to the first embodiment sequentially executes the first sense operation, the first write operation, and the second sense operation on the selected memory cell MC.

In each of the first sense operation and the second sense operation, the memory device 1 performs the following control on the word line WL and the bit line BL corresponding to the selected memory cell MC. First, the memory device 1 stabilizes the voltage of the bit line BL applying the voltage VBLP and then turns the bit line BL into the floating state. The memory device 1 applies the voltage VSS to the word line WL while keeping the bit line BL in the floating state. While the voltage of the word line WL decreases by the application of the voltage VSS, the voltage difference between the bit line BL and the word line WL exceeds the voltage VSB. As described above, when the voltage difference reaches the voltage VSB, the switching element S in the selected memory cell MC changes from the off state to the on state and becomes conductive, and the cell current flowing through the selected memory cell MC rapidly increases. The cell current flows out from the bit line BL via the word line WL and the transistor Tr8 of the read sink RS. Thus, the voltage of the bit line BL decreases. In this manner, the memory device 1 decreases the voltage of the bit line BL in each of the first sense operation and the second sense operation.

In such a decrease in the voltage of the bit line BL, the rate of the decrease in the voltage of the bit line BL and the voltage of the bit line BL stabilized after the decrease are different between the case where the selected memory cell MC is in the high resistance state HRS and the case where the selected memory cell MC is in the low resistance state DRS.

In the first sense operation, the memory device 1 samples the voltage Vsmp1 of the bit line BL at the time T04s reached when the time Δts described with reference to FIG. 10 has elapsed from the time T04 at which the discharge of the bit line BL is started. In the second sense operation, the memory device 1 samples the voltage Veva1 of the bit line BL at the time T24s reached when the time Δts has elapsed from the time T24 at which the discharge of the bit line BL is started. At the time when the sampling is performed in this manner, at least in the case where the selected memory cell MC is in the high resistance state HRS, the voltage of the bit line BL continues to change.

For example, a case where the selected memory cell MC is in the high resistance state HRS at the start of the first sense operation and the selected memory cell MC is in the low resistance state LRS during the second sense operation will be described. In this case, the difference between the voltage Vsmp1 and the voltage Veva1 sampled as described above is the voltage difference VD1. On the other hand, when the voltage is sampled at a timing when the voltage of the bit line BL is stable after the decrease in both the first sense operation and the second sense operation (hereinafter, referred to as the case of the comparative example), the difference between the sampled voltages is the voltage difference VD1x. As described with reference to FIG. 10, the voltage difference VD1 is larger than the voltage difference VD1x. The memory device 1 determines the data stored in the selected memory cell MC at the start of the first sense operation based on the voltage difference VD1.

As described above, the memory device 1 can execute the read operation based on a larger sense margin in the case where the selected memory cell MC is in the high resistance state HRS and in the case where the selected memory cell MC is in the low resistance state LRS as compared with the case of the comparative example. For example, even when there is a reproducibility variation in the voltage of the bit line BL after discharge, the memory device 1 can accurately execute the read operation. Therefore, with the memory device 1 according to the first embodiment, the frequency of erroneous reading can be reduced, and the design of the operational amplifier circuit AMP for executing the accurate read operation can be facilitated.

Further, with the memory device 1, the time from the start of the discharge of the voltage of the bit line BL to the sampling of the voltage of the bit line BL is shorter in each of the first sense operation and the second sense operation than in the case of the comparative example. Therefore, with the memory device 1 according to the first embodiment, the speed of the read operation can be increased.

Figure 11:
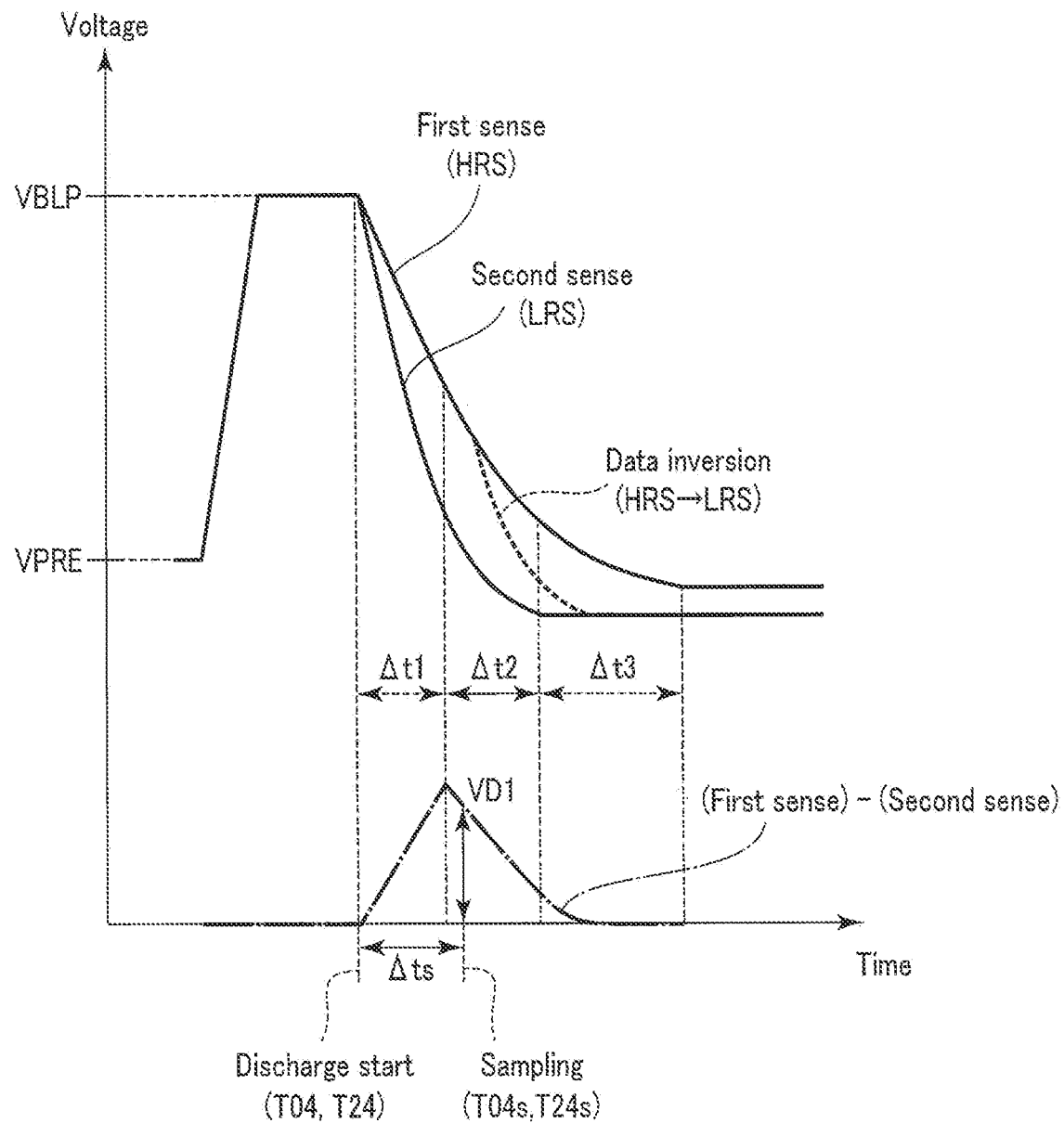
FIG. 11 is a diagram for explaining further advantageous effects that can be obtained by the memory device according to the first embodiment.

Further, with the memory device 1 according to the first embodiment, the advantageous effects described below can also be obtained. FIG. 11 is a diagram for explaining further advantageous effects that can be obtained by the memory device 1 according to the first embodiment.

In the first sense operation in the example of FIG. 9, the cell current flows from the bit line BL to the word line WL via the selected memory cell MC while the voltage of the bit line BL after the time T04 decreases. When the selected memory cell MC is in the high resistance state HRS, the cell current can function as a write current flowing in the direction A1 of the example of FIG. 5, and thus, the MTJ element can be turned into the low resistance state LRS, that is, the selected memory cell MC can be turned into the low resistance state LRS. This means that the data stored in the selected memory cell MC can be inverted (read disturb) in the middle of the first sense operation. On the other hand, in the second sense operation of the example of FIG. 9, such data inversion does not occur. This is because in the first write operation and the second sense operation, the cell current is controlled to flow through the selected memory cell MC in the same direction.

FIG. 11 is obtained by replacing the waveform of the bit line BL in the first sense operation in FIG. 10 with a waveform in a case where such data inversion occurs at an early timing.

As illustrated in FIG. 11, the memory device 1 can perform voltage sampling before the difference in voltage of the bit line BL in the first sense operation and the second sense operation disappears due to data inversion.

Therefore, even when such data inversion occurs in the first sense operation, the memory device 1 according to the first embodiment can accurately read the data stored in the selected memory cell at the start of the first sense operation.

[Modification]

Another operation example in which the memory device 1 executes a certain read operation will be described. Differences from the above described operation example and advantageous effects will be mainly described.

FIG. 12 illustrates an example of a timing chart illustrating temporal changes in voltages applied to the bit line BL and the word line WL corresponding to the selected memory cell MC when a memory device 1 according to a modification of the first embodiment, executes the read operation.

Also in the read operation, the first sense operation, the first write operation, and the second sense operation are sequentially executed on the selected memory cell MC, and the data stored in the selected memory cell MC at the start of the first sense operation is determined after the second sense operation. A second write operation can also be executed based on the determination result.

At time T30 before the start of the read operation, the control as described in connection with the time T00 of FIG. 9 is performed with respect to the bit line BL and the word line WL.

First, control executed in the first sense operation will be described.

In the description up to the time T04 regarding the first, sense operation of FIG. 9, the description in which the time T01 is replaced with time T31, the time T02 is replaced with time T32, the time T03 is replaced with time T33, and the time T04 is replaced with time T34 holds. The time T34 and subsequent times will be described. Similarly to the example of FIG. 9, a case where the selected memory cell MC is in the high resistance state HRS at the start of the first sense operation will be described.

The voltage VPRE is applied to the word line WL at time T35 while the decrease in the voltage of the bit line BL started at the time T34 continues. The application of the voltage VPRE is executed by turning the transistor Tr8 of the read sink RS into the off state and the transistor Tr7 of the precharge circuit RPC to the on state.

While the voltage of the word line WL increases by the application of the voltage VPRE, the voltage difference between the bit line BL and the word line WL falls below the voltage Vh1$d$H. As described above, when the voltage difference reaches the voltage Vh1$d$H, the switching element S in the selected memory cell MC changes from the on state to the off state, and the cell current flowing through the selected memory cell MC rapidly decreases. Therefore, no cell current flows through the selected memory cell MC, and the voltage of the bit line BL is held.

For the subsequent first write operation, the description in which the time T11 is replaced with time T41 and the time T12 is replaced with time T42 holds in the description of the first write operation of FIG. 9.

The control executed in the subsequent second sense operation will be described.

In the description up to the time T24 regarding the second sense operation of FIG. 9, the description in which the time T21 is replaced with time T51, the time T22 is replaced with time T52, the time T23 is replaced with time T53, and the time T24 is replaced with time T54 holds. The time T54 and subsequent times will be described.

The voltage VPRE is applied to the word line WL at time T55 while the decrease in the voltage of the bit line BL started at the time T54 continues as described in connection with the time T35.

While the voltage of the word line WL increases by the application of the voltage VPRE, the voltage difference between the bit line BL and the word line WL falls below the voltage Vh1$d$L. As described above, when the voltage difference reaches the voltage Vh1$d$L, the switching element S in the selected memory cell MC changes from the on state to the off state, and the cell current flowing through the selected memory cell MC rapidly decreases. Therefore, no cell current flows through the selected memory cell MC, and the voltage of the bit line BL is held.

Figure 13:
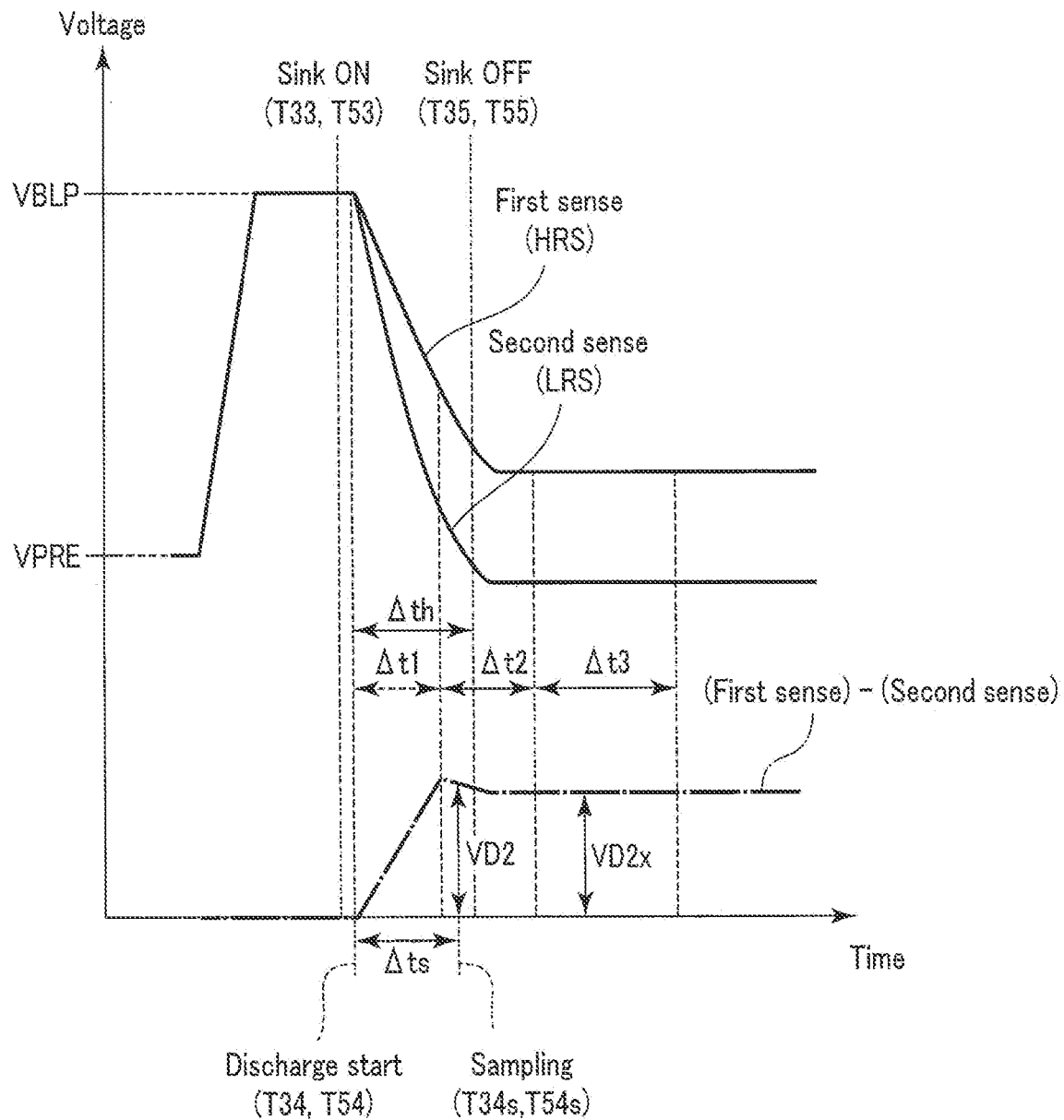
FIG. 13 is a diagram for explaining timing of voltage sampling in a first sense operation and a second sense operation by a sense amplifier of the memory device according to the modification of the first embodiment.

FIG. 13 is a diagram for explaining timing of voltage sampling in the first sense operation and the second sense operation by the sense amplifier 8$k$ of the memory device 1 according to the modification of the first embodiment.

FIG. 13 illustrates a diagram in which waveforms of voltages of the bit line BL in the first sense operation and the second sense operation illustrated in FIG. 12 are superimposed. More specifically, the two waveforms are superimposed such that times T34 and T54 at which the discharge of the bit line BL starts are at the same position on the horizontal axis. In the example of FIG. 13, the time from the time T31 to the time T33 is the same as the time from the time T51 to the time T53. The time, from the time T33 to the time T34 is substantially equal to the time from the time T53 to the time T54. Further, in the example of FIG. 13, the time from the time T34 to the time T35 is the same as the time from the time T54 to the time T55.

Similar to FIG. 10, FIG. 13 further illustrates, by the alternate long and short dash line, the state in which the difference in voltage, of the bit line BL between the first sense operation and the second sense operation changes according to the elapsed time at the point of time when the same time has elapsed from the start of discharge of the bit line BL.

The difference in voltage is the same as the case of the example of FIG. 10 from when the transistor Tr8 of the read sink RS is turned into the on state (the read sink RS is turned into the on state) and the discharge is started to when the transistor Tr8 of the read sink RS is turned into the off state (the read sink RS is turned into the off state). The difference in voltage is held when the read sink RS is turned into the off state and the transistor Tr7 of the precharge circuit RPC is turned into the on state. This is because the voltage of the bit line BL in each of the first sense operation and the second sense operation is held. In FIG. 13, the difference in voltage after holding is indicated as voltage difference VD2$x$.

In the operation of the example of FIG. 12, at least in a case where the selected memory cell MC is in the high resistance state HRS in the first sense operation, the voltage difference VD2$x$ is larger than, for example, the voltage difference VD1$x$ in the case of the comparative example described above. This is because time Δth from the start of discharge of the bit line BL until the read sink RS is turned into the off state is more than or equal to the time Δt1 but less than the time of the sum of the time Δt1, the time Δt2, and the time Δt3.

FIG. 13 illustrates that, in the first sense operation, similarly to the example of FIG. 10, the voltage of the bit line BL is sampled at a time (indicated as time T34$s$ in FIG. 13) when time fits elapses from the discharge start time T34. In addition, also in the second sense operation, similarly to the example of FIG. 10, it is illustrated that the voltage of the bit line BL is sampled at a time (indicated as time T54s in FIG. 13) when time Δts elapses from the discharge start time T54. FIG. 13 illustrates an example of the case where the time Δts is more than or equal to the time Δt1 but less than the time of the sum of the time Δt1 and the time Δt2 in the range of the time Δts described with reference to FIG. 10. The change of the read sink RS to the off state described above is performed after the sampling for each of the first sense operation and the second sense operation. FIGS. 12 and 13 illustrate an example of the case where the time Δth is more than or equal to the time Δts but less than the time of the sum of the time Δt1 and the time Δt2. The difference in voltage of the bit line BL sampled in each of the first sense operation and the second sense operation is a voltage difference VD2. The voltage difference VD2 is larger than or equal to the voltage difference VD2x and is larger than the voltage difference VD1x in the case of the comparative example.

Although the case where the time Δth is more than or equal to the time Δts and less than the time of the sum of the time Δt1 and the time Δt2 has been described above, the time Δth is not limited thereto as long as it is more than or equal to the time Δts. In a case where the time Δth is, for example, equal to or more than the time of the sum of the time Δt1 and the time Δt2 and is less than the time of the sum of the time Δt1, the time Δt2, and the time Δt3, regarding the second sense operation, unlike the case described regarding the time T55 in the example of FIG. 12, the voltage of the bit line BL is stable at the timing when the read sink RS is turned into the off state.

In the above, the case where the time Δts is more than or equal to the time Δt1 but less than the time of the sum of the time Δt1 and the time Δt2 has been described as an example. The technology disclosed in the present modification is applicable as long as the time Δts satisfies the condition described with reference to FIG. 10. For example, a case where the time Δts is more than or equal to the time of the sum of the time Δt1 and the time Δt2 and less than the time of the sum of the time Δt1, the time Δt2, and the time Δt3 will also be described. Also in this case, regarding the second sense operation, unlike the case described regarding the time T55 of the example of FIG. 12, the voltage of the bit line BL is stable at the timing when the read sink RS is turned into the off state.

As described above, the read sink RS may be turned into the off state without waiting for the stabilization of the voltage following the sampling of the voltage while the voltage of the bit line BL decreases. In the examples of FIGS. 12 and 13, the time from the start of discharge of the bit line BL to the time when the read sink RS is turned into the off state is the same in the first sense operation and the second sense operation. However, the time from the start of discharge of the bit line BL until the read sink RS is turned into the off state may be different between the first sense operation and the second sense operation. Further, in each of the first sense operation and the second sense operation, the read sink RS may be turned into the off state at the same timing from the start of the discharge of the bit line BL, and the voltage of the bit line BL may be sampled after the read sink RS is turned into the off state.

As described above, in the modification of the first embodiment, for example, at least in the case where the selected memory cell MC is in the high resistance state HRS, the read sink RS is turned into the off state at the timing while the voltage of the bit line BL decreases. As the read sink RS is turned into the off state early in this manner, the time during which the current flows through the selected memory cell MC is shortened, and thus deterioration of the memory cell is suppressed.

With the memory device 1 according to the modification of the first embodiment, even if the voltage of the bit line BL is sampled after the read sink RS is turned off, the difference in voltage sampled in the first sense operation and the second sense operation is expected to increase, but since the discharge of the bit line BL is forcibly stopped, the reproducibility variation in the voltage of the bit line BL can occur. However, by performing sampling before the read sink RS is turned off in a situation where the reproducibility variation occurs, the memory device 1 according to the modification of the first embodiment can suppress the reproducibility variation and accurately sample the voltage of the bit line BL.

<Second Embodiment>

Hereinafter, a memory device 1a according to the second embodiment will be described.

The configuration of the memory device 1a according to the second embodiment will be mainly described in terms of differences from the configuration of the memory device 1 according to the first embodiment.

FIG. 14 is a block diagram illustrating an example of a configuration of the memory device 1a according to the second embodiment. As the description of the configuration of the memory device 1a, the description in which the memory system 3 is replaced with a memory system 3a, the memory device 1 is replaced with the memory device 1a, and the sequencer 15 is replaced with a sequencer 15a in the description of FIG. 1 holds.

Note that, regarding the memory device 1a, the description in which the memory device 1 is replaced with the memory device 1a and the sequencer 15 is replaced with the sequencer 15a in the description of FIGS. 2 to 8 holds. Each of a plurality of memory cells MC of a memory cell array MCA of the memory device 1a is grouped so as to be included in any group of the plurality of groups.

The sequencer 15a includes a group determination circuit 152. Based on address information transferred from a command/address input circuit 14 to the sequencer 15a, the group determination circuit 152 determines in which group the memory cell MC, which is a target of the read operation, is included among the plurality of groups. The sequencer 15a performs timing control in the read operation based on the result of the determination.

FIG. 15 illustrates an example of a layout of various interconnects that can serve as a voltage transfer path to each memory cell MC of the memory device 1a according to the second embodiment.

In the example of FIG. 15, each of word lines WL0 to WL(n−1) extends in a first direction D1 in a certain interconnect layer, and these word lines WL are sequentially provided to be adjacent in the order of the word line WL0, the word line WL1, . . . , and the word line WL(n−1) with intervals along a second direction D2. In the example of FIG. 15, each of bit lines BL0 to BL(m−1) extends in the second direction D2 in another interconnect layer, and these bit lines BL are sequentially provided to be adjacent in the order of the bit line BL0, the bit line BL1, . . . , and the bit line BL(m−1) with intervals along the first direction D1.

In the example of FIG. 15, a global word line GWL is provided to extend in the second direction D2, and a global bit line GBL is provided to extend in the first direction D1.

For example, the relationship described below holds for a portion of the global word line GWL coupled to a read sink RS and a portion of the global word line GWL electrically coupled to each of the word lines WL0 to WL(n−1) via a row transfer switch group RTS. That is, the distance from the portion coupled to the read sink RS to the portion electrically coupled to each word line WL increases in the order of the word line WL0, the word line WL1, . . . , and the word line WL(n−1).

For example, the relationship described below holds for a portion of the global bit line GBL coupled to a sense amplifier SA and a portion of the global bit line GBL electrically coupled to each of the bit lines BL0 to BL(m−1) via a column transfer switch group CTS. That is, the distance from the portion coupled to the sense amplifier SA to the portion electrically coupled to each bit line BL increases in the order of the bit line BL0, the bit line BL1, . . . , and the bit line BL(m−1).

From such an arrangement of various interconnects, for example, the relationship described below holds for a path from the sense amplifier SA to the read sink RS via each memory cell MC. In FIG. 15, such paths are indicated by the two-dot chain lines.

The path related to the memory cell MC (in FIG. 15, reference numeral MC(n−1, 0) is attached) coupled between the bit line BL0 and the word line WL (n−1) is longer than the path related to the memory cell MC (in FIG. 15, reference numeral MC(0, 0) is attached) coupled between the bit line BL0 and the word line WL0. More specifically, the path related to the memory cell MC(n−1, 0) is longer by a path between portions of the bit line BL0 respectively coupled to the memory cells MC(0, 0) and MC(n−1, 0) and a path between portions of the global word line GWL respectively electrically coupled to the word lines WL0 and WL(n−1).

Further, the path related to the memory cell MC (in FIG. 15, reference numeral MC(0, m−1) is attached) coupled between the bit line BL(m−1) and the word line WL0 is longer than the path related to the memory cell MC(0, 0). More specifically, the path related to the memory cell MC(0, m−1) is longer by a path between portions of the global bit line GBL respectively electrically coupled to the bit lines BL0 and BL(m−1) and a path between portions of the word line WL0 respectively coupled to the memory cells MC(0, 0) and MC(0, m−1).

As described above, the path from the sense amplifier SA to the read sink RS via a certain memory cell MC becomes longer as the word line WL corresponding to the memory cell MC is the word line WL0, the word line WL1, . . . , and the word line WL(n−1). Hereinafter, the description will be given assuming that the word line WL having a shorter path such as the word line WL0 is closer to the "near" side and the word line WL having a longer path such as the word line WL(n−1) is closer to the "far" side.

On the other hand, the path becomes longer as the bit line BL corresponding to the memory cell MC is the bit line BL0, the bit line BL1, . . . , and the bit line BL(m−1). Hereinafter, the description will be given assuming that the bit line BL having a shorter path such as the bit line BL0 is closer to the "near" side and the bit line BL having a longer path such as the bit line BL(m−1) is closer to the "far" side.

Figure 16:
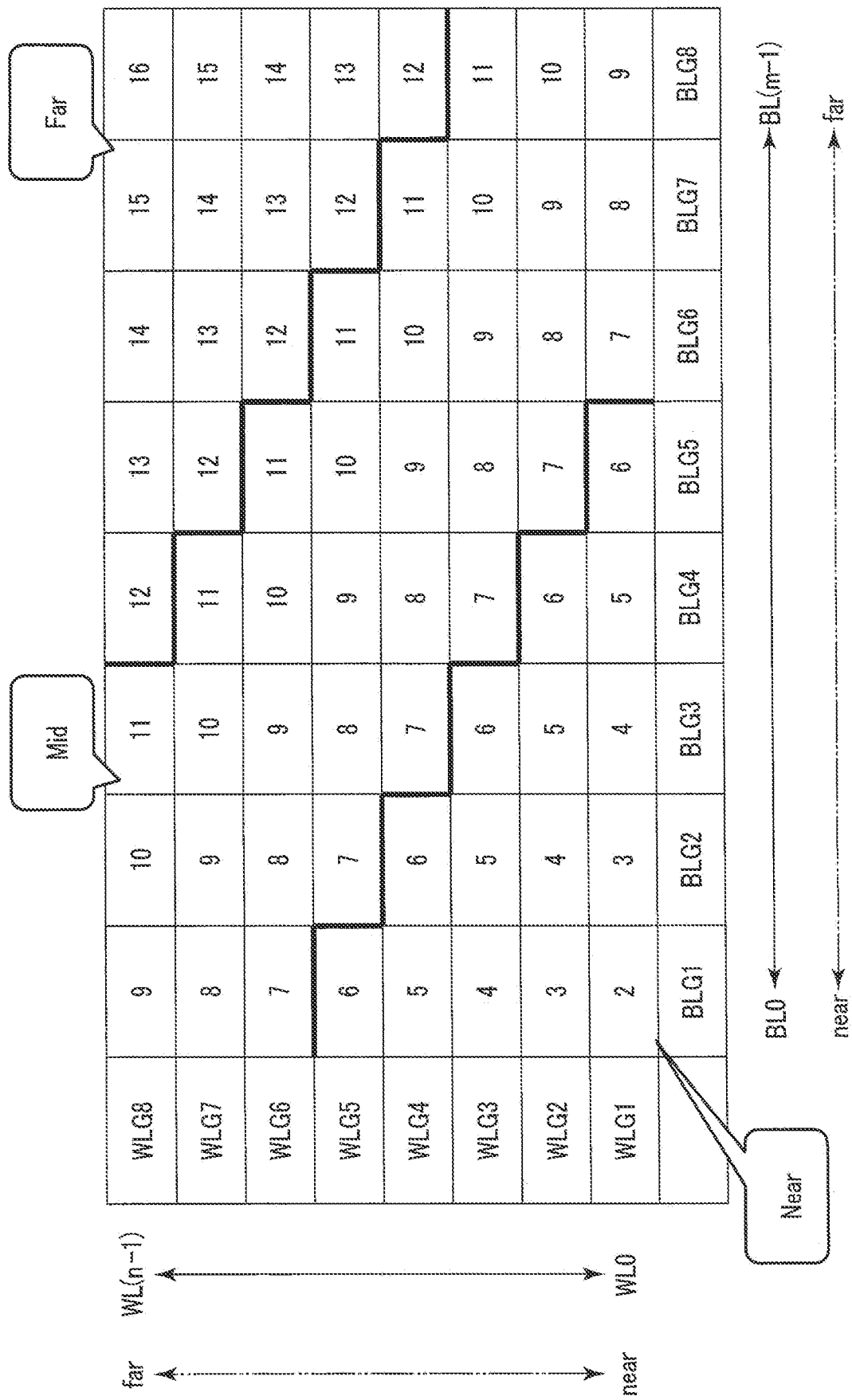
FIG. 16 is a diagram for explaining grouping of memory cells for timing control, executed by the memory device according to the second embodiment in a read operation.

FIG. 16 is a diagram for explaining grouping of memory cells MC for timing control executed by the memory device 1a according to the second embodiment in the read operation. The grouping described below is merely an example, and the grouping according to the present embodiment is not limited thereto.

First, grouping of the word lines WL will be described.

Each of the word lines WL0 to WL(n−1) is included in any of a plurality of word line groups WLG. Each of the word line groups WLG includes, for example, a plurality of word lines WL. The number of word lines WL constituting a single word line group WLG may or may not be the same among all the word line groups WLG.

The grouping is performed such that a word line group WLGp having a smaller integer p (p is an integer of 1 or more and 8 or less) is configured by word lines WL closer to the "near" side, and a word line group WLGp having a larger integer p is configured by word lines WL closer to the "far" side.

Next, an example of grouping of the bit lines BL will be described.

Each of the bit lines BL0 to BL(m−1) is included in any of a plurality of bit line groups BLG. Each of the bit line groups BLG includes, for example, a plurality of bit lines BL. The number of bit lines BL constituting a single bit line group BLG may or may not be the same among all the bit line groups BLG.

The grouping is performed such that a bit line group BLGq having a smaller integer q (q is an integer of 1 or more and 8 or less) is configured by bit lines BL closer to the "near" side, and a bit line group BLGq having a larger integer q is configured by bit lines BL closer to the "far" side.

Next, grouping of the memory cells MC will be described.

When the word line WL corresponding to a certain memory cell MC is included in a word line group WLGt and the bit line BL corresponding to the memory cell MC is included in a bit line group BLGu, a numerical value of (t+u) is assigned to the memory cell MC. Such, assignment of numerical value is performed for each case where t is an integer of 1 to 8 and for each case where u is an integer of 1 to 8. FIG. 16 illustrates numerical values assigned in this manner.

When the numerical value assigned to a certain memory cell MC in such manner is, for example, 6 or less, the memory cell MC is included in a "Near" group. When the numerical value assigned to a certain memory cell MC in such manner is, for example, 7 or more and 11 or less, the memory cell MC is included in a "Mid" group. When the numerical value assigned to a certain memory cell MC in such manner is, for example, 12 or more, the memory cell MC is included in a "Far" group.

Hereinafter, differences between the operation of the memory device 1a according to the second embodiment and the operation of the memory device 1 according to the first embodiment will be mainly described.

The description equivalent to that given with reference to FIGS. 9 and 10 holds for a case where a certain memory cell MC in the "Near" group is a selected memory cell MC (hereinafter, also referred to as the case "Near") and a case where a certain memory cell MC in the "Far" group is a selected memory cell MC (hereinafter, also referred to as the case "Far").

FIG. 17 is a diagram for explaining timing of voltage sampling in a first sense operation and a second sense operation by the sense amplifier SA of the memory device 1a according to the second embodiment.

FIG. 17 illustrates a diagram equivalent to FIG. 10 in the case "Near" and a diagram equivalent to FIG. 10 in the case "Far" together.

Regarding the case "Near", the time corresponding to the time $\Delta t1$ in the example of FIG. 10 is indicated as time $\Delta t1n$, and similarly, the time corresponding to the time $\Delta t2$ is indicated as time $\Delta t2n$, and the time corresponding to the time $\Delta t3$ is indicated as time $\Delta t3n$. Regarding the case "Far", the time corresponding to the time $\Delta t1$ in the example of FIG. 10 is indicated as time $\Delta t1f$, and similarly, the time corresponding to the time $\Delta t2$ is indicated as time $\Delta t2f$, and the time corresponding to the time $\Delta t3$ is indicated as time $\Delta t3f$.

The time $\Delta t1f$ is longer than the time $\Delta t1n$, the time $\Delta t2f$ is longer than the time $\Delta t2n$, and the time $\Delta t3f$ is longer than the time $\Delta t3n$. This is because the path from the sense amplifier SA to the read sink RS via the selected memory cell MC is longer in the case "Far" than in the case "Near" as described with reference to FIG. 15, and thus an RC delay in the path used for discharge of the bit line BL is large.

In the case "Near", in both the first sense operation and the second sense operation, the voltage of the bit line BL is sampled, for example, during a period from the start of discharge until the time $\Delta t1n$ elapses but the time of the sum of the time $\Delta t1n$, the time $\Delta t2n$, and the time $\Delta t3n$ does not elapse. In the case "Near", the time from the start of discharge to the sampling of the voltage of the bit line BL is the same in the first sense operation and the second sense operation.

In the case "Far", in both the first sense operation and the second sense operation, the voltage of the bit line BL is sampled, for example, during a period from the start of discharge until the time $\Delta f1f$ elapses but the time of the sum of the time $\Delta t1f$, the time $\Delta t2f$, and the time $\Delta t3f$ does not elapse. In the case "Far", the time from the start of discharge to the sampling of the voltage of the bit line BL is the same in the first sense operation and the second sense operation.

The time from the start of discharge of the bit line BL to the sampling of the voltage of the bit line BL may be different between the case "Near" and the case "Far". When the difference in voltage of the bit line BL between the first sense operation and the second sense operation daring sampling the voltage of the bit line BL is about the same between the case "Near" and the case "Far", for example, the time from the start of discharge of the bit line BL to the sampling of the voltage of the bit line BL is longer in the case "Far" than in the case "Near".

For a plurality of or all the memory cells MC of the "Near" group, for example, even when any of these memory cells MC is the selected memory cell MC, the time from the start of discharge of the bit line BL to the sampling of the voltage of the bit line BL is substantially the same. Also for a plurality of or all the memory cells MC of the "Far" group, for example, even when any of these memory cells MC is the selected memory cell MC, the time from the start of discharge of the bit line BL to the sampling of the voltage of the bit line BL is substantially the same.

Such control of the sampling timing according to the group is performed, for example, under the control of the sequencer 15a based on the determination result of the group related to the selected memory cell MC by the group determination circuit 152.

In the above, the case where a certain memory cell MC in the "Near" group is the selected memory cell MC and the case where a certain memory cell MC in the "Far" group is the selected memory cell MC have been described as an example. When the memory cells MC are divided into a plurality of groups as described with reference to FIG. 16 timing control similar to that described above can be performed for the memory cells MC of any two different groups.

With the memory device 1a according to the second embodiment, in addition to the advantageous effects described in the first embodiment, the advantageous effects described below can also be obtained.

The memory device 1a can set the time from the start of the discharge of the bit line BL to the sampling of the voltage of the bit line BL used in the read operation of the example of FIG. 9, for example, for each group including the selected memory cell MC in the same manner as described with reference to FIG. 10. In each group, as long as the memory cell MC of the group is the selected memory cell, for example, the difference in RC delay in the path of discharge of the bit line BL described above is relatively small. That is, the memory device 1a sets the timing of sampling the voltage of the bit line BL at which the sense margin can be unfailingly obtained for each group. Therefore, even when the difference in the RC delay can increase depending on which memory cell MC of the memory cell array MCA is the selected memory cell MC, the memory device 1a can unfailingly execute the aforementioned read operation based on a larger sense margin.

Therefore, with the memory device 1a according to the second embodiment, as described in the first embodiment, the frequency of erroneous reading can be reduced, and the design of an operational amplifier circuit AMP for executing the accurate read operation can be facilitated.

<Other Embodiment>

In an example of the read operation also referred to as the self-reference read operation described above, the voltage of the bit line coupled to the selected memory cell is sensed in each of the first sense operation and the second sense operation, and the sensed two voltages are compared to determine the read data. The technology disclosed in the present specification can also be applied to other read operations. For example, the technology disclosed in the present specification can be applied to the read operation in which a value of a certain physical quantity related to a certain component when a memory cell is in a high resistance state and a value of the physical quantity related to the component or another component when the memory cell is in a low resistance state are sensed, and data stored in the memory cell is determined based on a difference between the two values. The physical quantity may be, for example, a voltage or a current.

In the present specification, "coupling" refers to electrical coupling, and does not exclude, for example, interposition of another element.

In the present specification, the notations "same", "consistent", "constant", "maintain" and the like are intended to be used to include a case where there is an error within the scope of design when carrying out the technology described in the embodiments. The same applies to a case where the term "substantial" is used in combination with these notations, such as "substantially the same". In addition, the notation "application or supply of a certain voltage" is intended to be used to include both performing control to apply or supply the voltage and actually applying or supplying the voltage. Further, applying or supplying a certain voltage may include applying or supplying a voltage of, for example, 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first memory cell including a first variable resistance element and a first switching element; and
a control circuit configured to execute first detection of detecting a first value of a first physical quantity related to the first memory cell, execute first write for storing first data in the first memory cell, execute second detection of detecting a second value of the first physical quantity related to the first memory cell following the first write, and read second data related to the first memory cell based on the first value and the second value, wherein
at least one of the first value and the second value is a value during a change in the first physical quantity related to the first memory cell.

2. The memory device according to claim 1, wherein
at least one of the first value and the second value is detected while the first physical quantity related to the first memory cell changes.

3. The memory device according to claim 1, wherein
the second data is data stored in the first memory cell at start of the first detection.

4. The memory device according to claim 1, wherein
each of the first value and the second value is a value obtained by changing the first physical quantity from a third value.

5. The memory device according to claim 4, wherein
first time from start of change in the first physical quantity to detection of the first value in the first detection is substantially equal to second time from start of the change in the first physical quantity to detection of the second value in the second detection.

6. The memory device according to claim 1, wherein
the first physical quantity is a voltage of a first interconnect coupled to the first memory cell.

7. The memory device according to claim 6, wherein
the control circuit is further configured to:
in the first detection, apply a first voltage to the first interconnect, then turn the first interconnect into a floating state, and while the first interconnect is in the floating state, apply a second voltage lower than the first voltage to a second interconnect coupled to the first memory cell to decrease the voltage of the first interconnect, and
in the second detection, apply the first voltage to the first interconnect, then turn the first interconnect into the floating state, and while the first interconnect is in the floating state, apply the second voltage to the second interconnect to decrease the voltage of the first interconnect,
each of the first value and the second value is a value obtained by decreasing the voltage of the first interconnect from the first, voltage, and
at least one of the first value and the second value is a value during the decrease in the voltage of the first interconnect.

8. The memory device according to claim 7, wherein
at least one of the first value and the second value is detected while the voltage of the first interconnect decreases.

9. The memory device according to claim 7, wherein
first time from start of the decrease in the voltage of the first interconnect to detection of the first value in the first detection is substantially equal to second time from start of the decrease in the voltage of the first interconnect to detection of the second value in the second detection.

10. The memory device according to claim 7, wherein
when the first variable resistance element is in a low resistance state at start of the first detection, the voltage of the first interconnect stabilized after the decrease in the first detection is lower than when the first variable resistance element is in a high resistance state.

11. The memory device according to claim 7, wherein
when the first value is a value during the decrease in the voltage of the first interconnect,
the control circuit is further configured not to apply the second voltage to the second interconnect during the decrease in the voltage of the first interconnect in the first detection, and
when the second value is a value during the decrease in the voltage of the first interconnect,
the control circuit is further configured not to apply the second voltage to the second interconnect during the decrease in the voltage of the first interconnect in the second detection.

12. The memory device according to claim 7, further comprising:
a second memory cell including a second variable resistance element and a second switching element, wherein
the control circuit is further configured to:
execute third detection of applying the first voltage to a third interconnect coupled to the second memory cell, then turning the third interconnect into the floating state, and while the third interconnect is in the floating state, applying the second voltage to a fourth interconnect coupled to the second memory cell to decrease the voltage of the third interconnect, and detecting a third value obtained by decreasing the voltage of the third interconnect from the first voltage;
execute second write for storing the first data in the second memory cell;
execute, following the second write, fourth detection of applying the first voltage to the third interconnect, then turning the third interconnect into a floating state, and while the third interconnect is in the floating state, applying the second voltage to the fourth interconnect to decrease the voltage of the third interconnect, and detecting a fourth value obtained as a result of decrease in the voltage of the third interconnect from the first voltage; and
read third data related to the second memory cell based on the third value and the fourth value,
at least one of the third value and the fourth value is a value during the decrease in the voltage of the third interconnect,
first time from start of the decrease in the voltage of the first interconnect to detection of the first value in the first detection is substantially equal to second time from start of the decrease in the voltage of the first interconnect to detection of the second value in the second detection,
third time from start of the decrease in the voltage of the third interconnect to detection of the third value in the third detection is substantially equal to fourth time from start of the decrease in the voltage of the third interconnect to detection of the fourth value in the fourth detection,
the first memory cell is included in a first group, when the second memory cell is included in the first group, the first time is substantially equal to the third time, and when the second memory cell is included in a second group, the first time is different from the third time.

13. The memory device according to claim 12, wherein when the second memory cell is included in the second group, the first time is longer than the third time, and a discharge path of the first interconnect in the first detection is longer than a discharge path of the third interconnect in the third detection.

14. The memory device according to claim 1, wherein the first variable resistance element is a magnetic tunnel junction element.

* * * * *